United States Patent
Karim et al.

(12)

(10) Patent No.: US 8,072,050 B1
(45) Date of Patent: Dec. 6, 2011

(54) SEMICONDUCTOR DEVICE WITH INCREASED I/O LEADFRAME INCLUDING PASSIVE DEVICE

(75) Inventors: Nozad O. Karim, Chandler, AZ (US); Timothy L. Olson, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 45 days.

(21) Appl. No.: 12/273,500

(22) Filed: Nov. 18, 2008

(51) Int. Cl.
*H01L 21/4763* (2006.01)

(52) U.S. Cl. .................................. 257/666; 438/111

(58) Field of Classification Search ........... 237/666–677
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Quoc D Hoang
*Assistant Examiner* — Tony Tran
(74) *Attorney, Agent, or Firm* — Stetina Brunda Garred & Brucker

(57) ABSTRACT

In accordance with the present invention, there are provided multiple embodiments of a semiconductor package, each embodiment including a uniquely configured leadframe sized and configured to maximize the available number of exposed leads in the semiconductor package. More particularly, each embodiment of the semiconductor package of the present invention includes a generally planar die pad and a plurality of leads. Some of these leads include exposed bottom surface portions or lands which are provided in at least one row or ring which at least partially circumvents the die pad, with other leads including portions which protrude from respective side surfaces of a package body of the semiconductor package. A passive device may be electrically connected to and extend between the die pad and one of the leads, and/or may be electrically connected to and extend between and adjacent pair of the leads.

20 Claims, 7 Drawing Sheets

U.S. PATENT DOCUMENTS

| | | | |
|---|---|---|---|
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,554,886 A * | 9/1996 | Song .................. 257/666 |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davies et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,150,709 A | 11/2000 | Shin et al. |
| 6,157,074 A * | 12/2000 | Lee .................. 257/666 |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |

| | | | | | | |
|---|---|---|---|---|---|---|
| 6,204,554 B1 | 3/2001 | Ewer et al. | | 6,495,909 B2 | 12/2002 | Jung et al. |
| 6,208,020 B1 | 3/2001 | Minamio et al. | | 6,498,099 B1 | 12/2002 | McClellan et al. |
| 6,208,021 B1 | 3/2001 | Ohuchi et al. | | 6,498,392 B2 | 12/2002 | Azuma |
| 6,208,023 B1 | 3/2001 | Nakayama et al. | | 6,507,096 B2 | 1/2003 | Gang |
| 6,211,462 B1 | 4/2001 | Carter, Jr. et al. | | 6,507,120 B2 | 1/2003 | Lo et al. |
| 6,218,731 B1 | 4/2001 | Huang et al. | | 6,518,089 B2 | 2/2003 | Coyle |
| 6,222,258 B1 | 4/2001 | Asano et al. | | 6,525,942 B2 | 2/2003 | Huang et al. |
| 6,222,259 B1 | 4/2001 | Park et al. | | 6,528,893 B2 | 3/2003 | Jung et al. |
| 6,225,146 B1 | 5/2001 | Yamaguchi et al. | | 6,534,849 B1 | 3/2003 | Gang |
| 6,229,200 B1 | 5/2001 | McClellan et al. | | 6,545,332 B2 | 4/2003 | Huang |
| 6,229,205 B1 | 5/2001 | Jeong et al. | | 6,545,345 B1 | 4/2003 | Glenn et al. |
| 6,238,952 B1 | 5/2001 | Lin et al. | | 6,552,421 B2 | 4/2003 | Kishimoto et al. |
| 6,239,367 B1 | 5/2001 | Hsuan et al. | | 6,559,525 B2 | 5/2003 | Huang |
| 6,239,384 B1 | 5/2001 | Smith et al. | | 6,566,168 B2 | 5/2003 | Gang |
| 6,242,281 B1 | 6/2001 | McClellan et al. | | 6,580,161 B2 | 6/2003 | Kobayakawa |
| 6,256,200 B1 | 7/2001 | Lam et al. | | 6,583,503 B2 | 6/2003 | Akram et al. |
| 6,258,629 B1 | 7/2001 | Niones et al. | | 6,585,905 B1 | 7/2003 | Fan et al. |
| 6,261,864 B1 | 7/2001 | Jung et al. | | 6,603,196 B2 | 8/2003 | Lee et al. |
| 6,281,566 B1 | 8/2001 | Magni | | 6,624,005 B1 | 9/2003 | DiCaprio et al. |
| 6,281,568 B1 | 8/2001 | Glenn et al. | | 6,627,977 B1 | 9/2003 | Foster |
| 6,282,094 B1 | 8/2001 | Lo et al. | | 6,646,339 B1 | 11/2003 | Ku |
| 6,282,095 B1 | 8/2001 | Houghton et al. | | 6,667,546 B2 | 12/2003 | Huang et al. |
| 6,285,075 B1 | 9/2001 | Combs et al. | | 6,677,663 B1 | 1/2004 | Ku et al. |
| 6,291,271 B1 | 9/2001 | Lee et al. | | 6,686,649 B1 | 2/2004 | Mathews et al. |
| 6,291,273 B1 | 9/2001 | Miyaki et al. | | 6,696,752 B2 | 2/2004 | Su et al. |
| 6,294,100 B1 | 9/2001 | Fan et al. | | 6,700,189 B2 | 3/2004 | Shibata |
| 6,294,830 B1 | 9/2001 | Fjelstad | | 6,713,375 B2 | 3/2004 | Shenoy |
| 6,295,977 B1 | 10/2001 | Ripper et al. | | 6,757,178 B2 | 6/2004 | Okabe et al. |
| 6,297,548 B1 | 10/2001 | Moden et al. | | 6,800,936 B2 | 10/2004 | Kosemura et al. |
| 6,303,984 B1 | 10/2001 | Corisis | | 6,812,552 B2 | 11/2004 | Islam et al. |
| 6,303,997 B1 | 10/2001 | Lee | | 6,818,973 B1 | 11/2004 | Foster |
| 6,306,685 B1 | 10/2001 | Liu et al. | | 6,858,919 B2 | 2/2005 | Seo et al. |
| 6,307,272 B1 | 10/2001 | Takahashi et al. | | 6,867,492 B2 | 3/2005 | Auburger et al. |
| 6,309,909 B1 | 10/2001 | Ohgiyama | | 6,876,068 B1 | 4/2005 | Lee et al. |
| 6,316,822 B1 | 11/2001 | Venkateshwaran et al. | | 6,878,571 B2 | 4/2005 | Isaak et al. |
| 6,316,838 B1 | 11/2001 | Ozawa et al. | | 6,897,552 B2 | 5/2005 | Nakao |
| 6,323,550 B1 | 11/2001 | Martin et al. | | 6,927,478 B2 | 8/2005 | Paek |
| 6,326,243 B1 | 12/2001 | Suzuya et al. | | 6,967,125 B2 | 11/2005 | Fee et al. |
| 6,326,244 B1 | 12/2001 | Brooks et al. | | 6,995,459 B2 | 2/2006 | Lee et al. |
| 6,326,678 B1 | 12/2001 | Karmezos et al. | | 7,002,805 B2 | 2/2006 | Lee et al. |
| 6,335,564 B1 | 1/2002 | Pour | | 7,005,327 B2 | 2/2006 | Kung et al. |
| 6,337,510 B1 | 1/2002 | Chun-Jen et al. | | 7,015,571 B2 | 3/2006 | Chang et al. |
| 6,339,252 B1 | 1/2002 | Niones et al. | | 7,045,396 B2 | 5/2006 | Crowley et al. |
| 6,339,255 B1 | 1/2002 | Shin | | 7,053,469 B2 | 5/2006 | Koh et al. |
| 6,342,730 B1 | 1/2002 | Jung et al. | | 7,075,816 B2 | 7/2006 | Fee et al. |
| 6,348,726 B1 | 2/2002 | Bayan et al. | | 7,102,209 B1 | 9/2006 | Bayan et al. |
| 6,355,502 B1 | 3/2002 | Kang et al. | | 7,109,572 B2 | 9/2006 | Fee et al. |
| 6,359,221 B1 | 3/2002 | Yamada et al. | | 7,185,426 B1 | 3/2007 | Hiner |
| 6,362,525 B1 | 3/2002 | Rahim | | 7,193,298 B2 | 3/2007 | Hong et al. |
| 6,369,447 B2 | 4/2002 | Mori | | 7,211,471 B1 * | 5/2007 | Foster ..................... 438/123 |
| 6,369,454 B1 | 4/2002 | Chung | | 7,245,007 B1 | 7/2007 | Foster |
| 6,373,127 B1 | 4/2002 | Baudouin et al. | | 7,253,503 B1 | 8/2007 | Fusaro et al. |
| 6,377,464 B1 | 4/2002 | Hashemi et al. | | 2001/0008305 A1 | 7/2001 | McClellan et al. |
| 6,380,048 B1 | 4/2002 | Boon et al. | | 2001/0014538 A1 | 8/2001 | Kwan et al. |
| 6,384,472 B1 | 5/2002 | Huang | | 2002/0011654 A1 | 1/2002 | Kimura |
| 6,388,336 B1 | 5/2002 | Venkateshwaran et al. | | 2002/0024122 A1 | 2/2002 | Jung et al. |
| 6,395,578 B1 | 5/2002 | Shin et al. | | 2002/0027297 A1 | 3/2002 | Ikenaga et al. |
| 6,399,415 B1 | 6/2002 | Bayan et al. | | 2002/0038873 A1 | 4/2002 | Hiyoshi |
| 6,400,004 B1 | 6/2002 | Fan et al. | | 2002/0072147 A1 | 6/2002 | Sayanagi et al. |
| 6,410,979 B2 | 6/2002 | Abe | | 2002/0111009 A1 | 8/2002 | Huang et al. |
| 6,414,385 B1 | 7/2002 | Huang et al. | | 2002/0135049 A1 * | 9/2002 | Liu ............................ 257/666 |
| 6,420,779 B1 | 7/2002 | Sharma et al. | | 2002/0140061 A1 | 10/2002 | Lee |
| 6,421,013 B1 | 7/2002 | Chung | | 2002/0140068 A1 | 10/2002 | Lee et al. |
| 6,423,643 B1 | 7/2002 | Furuhata et al. | | 2002/0140081 A1 | 10/2002 | Chou et al. |
| 6,429,508 B1 | 8/2002 | Gang | | 2002/0158318 A1 | 10/2002 | Chen |
| 6,437,429 B1 | 8/2002 | Su et al. | | 2002/0163015 A1 | 11/2002 | Lee et al. |
| 6,444,499 B1 | 9/2002 | Swiss et al. | | 2002/0167060 A1 | 11/2002 | Buijsman et al. |
| 6,448,633 B1 | 9/2002 | Yee et al. | | 2003/0006055 A1 | 1/2003 | Chien-Hung et al. |
| 6,452,279 B2 | 9/2002 | Shimoda | | 2003/0030131 A1 | 2/2003 | Lee et al. |
| 6,459,148 B1 | 10/2002 | Chun-Jen et al. | | 2003/0059644 A1 | 3/2003 | Datta et al. |
| 6,464,121 B2 | 10/2002 | Reijinders | | 2003/0064548 A1 | 4/2003 | Isaak |
| 6,465,883 B2 | 10/2002 | Oloffson | | 2003/0073265 A1 | 4/2003 | Hu et al. |
| 6,472,735 B2 | 10/2002 | Isaak | | 2003/0102537 A1 | 6/2003 | McLellan et al. |
| 6,475,646 B2 | 11/2002 | Park et al. | | 2003/0164554 A1 | 9/2003 | Fee et al. |
| 6,476,469 B2 | 11/2002 | Hung et al. | | 2003/0168719 A1 | 9/2003 | Cheng et al. |
| 6,476,474 B1 | 11/2002 | Hung | | 2003/0198032 A1 | 10/2003 | Collander et al. |
| 6,482,680 B1 | 11/2002 | Khor et al. | | 2004/0027788 A1 | 2/2004 | Chiu et al. |
| 6,483,178 B1 | 11/2002 | Chuang | | 2004/0056277 A1 | 3/2004 | Karnezos |
| 6,492,718 B2 | 12/2002 | Ohmori et al. | | 2004/0061212 A1 | 4/2004 | Karnezos |

| | | | |
|---|---|---|---|
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0080025 A1 | 4/2004 | Kasahara et al. | |
| 2004/0089926 A1 | 5/2004 | Hsu et al. | |
| 2004/0097016 A1 | 5/2004 | Yee et al. | |
| 2004/0164387 A1 | 8/2004 | Ikenaga et al. | |
| 2004/0253803 A1 | 12/2004 | Tomono et al. | |
| 2005/0139969 A1* | 6/2005 | Lee et al. | 257/672 |
| 2005/0199987 A1 | 9/2005 | Danno et al. | |
| 2006/0087020 A1 | 4/2006 | Hirano et al. | |
| 2006/0157843 A1 | 7/2006 | Hwang | |
| 2006/0231939 A1 | 10/2006 | Kawabata et al. | |
| 2007/0023202 A1 | 2/2007 | Shibata | |
| 2008/0290486 A1* | 11/2008 | Chen et al. | 257/676 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 652333 | 9/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| JP | 2003243595 | 8/2003 |
| JP | 2004158753 | 6/2004 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

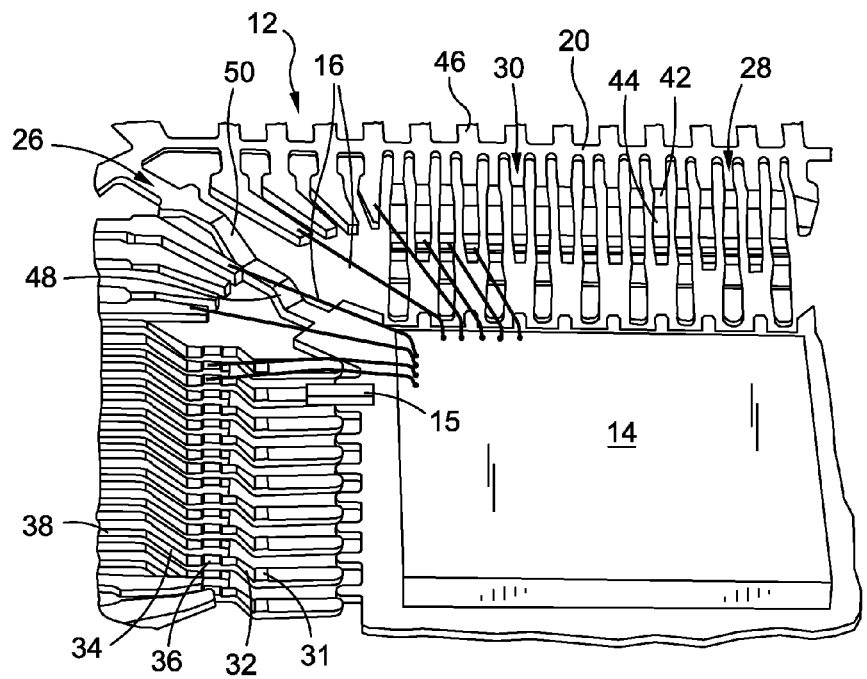
FIG. 5
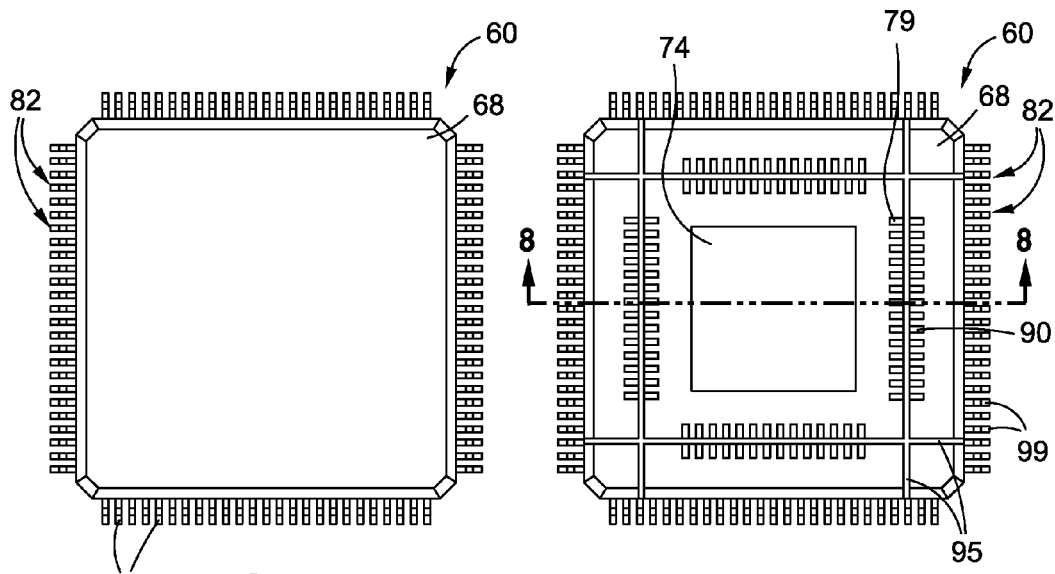
FIG. 6  FIG. 7

SEMICONDUCTOR DEVICE WITH INCREASED I/O LEADFRAME INCLUDING PASSIVE DEVICE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to an increased capacity QFP semiconductor package which includes exposed leads and an exposed die pad on the bottom surface of the package body thereof, and further includes one or more integrated passive components or devices to enhance electrical performance and reduce the number of component parts needed on an underlying printed circuit board or motherboard.

2. Description of the Related Art

Semiconductor dies are conventionally enclosed in plastic packages that provide protection from hostile environments and enable electrical interconnection between the semiconductor die and an underlying substrate such as a printed circuit board (PCB) or system board. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital televisions and other consumer electronics, there is an increasing need for QFP exposed pad packages of increased functional capacity, coupled with reduced size and weight. In this regard, with recent trends toward high integration and high performance semiconductor dies, there is a need for QFP packages which have a larger number of I/O's with excellent thermal and electrical properties, yet are of minimal size so as not to occupy the limited space available on an underlying PCB. In an attempt to address these needs, Applicant has developed the semiconductor packages described in co-pending U.S. patent application Ser. Nos. 11/425,505 and 11/775,566, the disclosures of which are incorporated herein by reference. The present invention comprises an enhancement to the semiconductor package designs described in the aforementioned co-pending patent applications of Applicant. More particularly, the semiconductor device or package of the present invention includes one or more integrated passive components or devices which is/are operative to enhance the electrical performance of the semiconductor package, while at the same time reducing the number of component parts that must be included on the underlying PCB or motherboard. Though it is known in the prior art to integrate passive components into laminate and leadframe based semiconductor packages, none of the existing integration methods result in a semiconductor package configuration wherein at least one pad is provided on the semiconductor package and dedicated to the passive component for connectivity purposes. In addition, the design attributes of the semiconductor package of the present invention provide the freedom to change circuit topology without changing the semiconductor package design, thus helping circuit designers to change passive component interconnections on the motherboard without changing passive interconnection in the semiconductor package. These, as well as other features and attributes of the present invention will be discussed in more detail below.

BRIEF SUMMARY OF THE INVENTION

In accordance with the present invention, there are provided multiple embodiments of a semiconductor package, each embodiment including a uniquely configured leadframe sized and configured to maximize the available number of exposed leads in the semiconductor package. More particularly, each embodiment of the semiconductor package of the present invention includes a generally planar die paddle or die pad defining multiple peripheral edge segments. In addition, the semiconductor package includes a plurality of leads. Some of these leads include exposed bottom surface portions or lands which are provided in at least one row or ring which at least partially circumvents the die pad, with other leads including portions which protrude from respective side surfaces of a package body of the semiconductor package. Connected to the top surface of the die pad is at least one semiconductor die which is electrically connected to at least some of the leads. A passive device may be electrically connected to and extend between the die pad and one of the leads, and/or may be electrically connected to and extend between and adjacent pair of the leads. At least portions of the die pad, the leads, the passive device(s), and the semiconductor die are encapsulated by the package body, with at least portions of the bottom surfaces of the die pad and some of the leads being exposed in a common exterior surface of the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 5 is a partial, top perspective view of the leadframe, semiconductor die and passive component shown in FIG. 4;

FIG. 6 is a top plan view of a semiconductor package constructed in accordance with a second embodiment of the present invention;

FIG. 7 is a bottom plan view of the semiconductor package shown in FIG. 6;

Common reference numerals are used throughout the drawings and detailed description to indicate like elements.

DETAILED DESCRIPTION OF THE INVENTION

Figure 1:
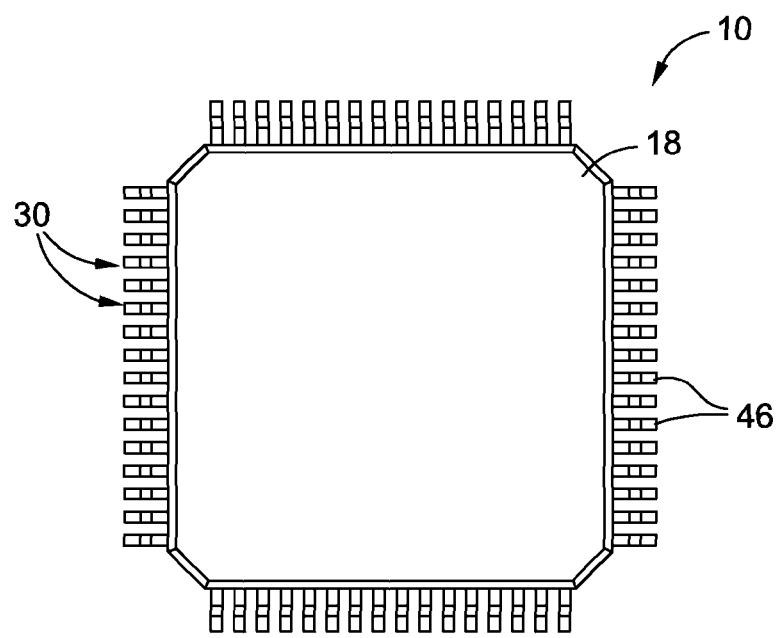
FIG. 1 is a top plan view of a semiconductor package constructed in accordance with a first embodiment of the present invention.

Referring now to the drawings wherein the showings are for purposes of illustrating various embodiments of the present invention only, and not for purposes of limiting the same, FIGS. 1-5 depict a semiconductor package 10 constructed in accordance with a first embodiment of the present invention. The major structural elements of the semiconductor package 10 include a leadframe 12 (shown in FIG. 4), a semiconductor die 14 attached to the leadframe 12 and electrically connected thereto by conductive wires 16, at least one passive component 15 electrically connected to the leadframe 12, and a package body 18 which fully encapsulates the semiconductor die 14, the passive component 15 and wires 16, and partially encapsulates the leadframe 12 in a manner which will be described in more detail below.

The leadframe 12 of the semiconductor package 10 includes a peripheral outer dambar 20 which defines a central opening 22. Located within the central opening 22 is a generally quadrangular die pad 24 of the leadframe 12. The die pad 24 defines opposed, generally planar top and bottom pad surfaces, and is connected to the dambar 20 by a plurality of tie bars 26 which extend diagonally from respective ones of the four corners defined by the die pad 24.

Figure 4:
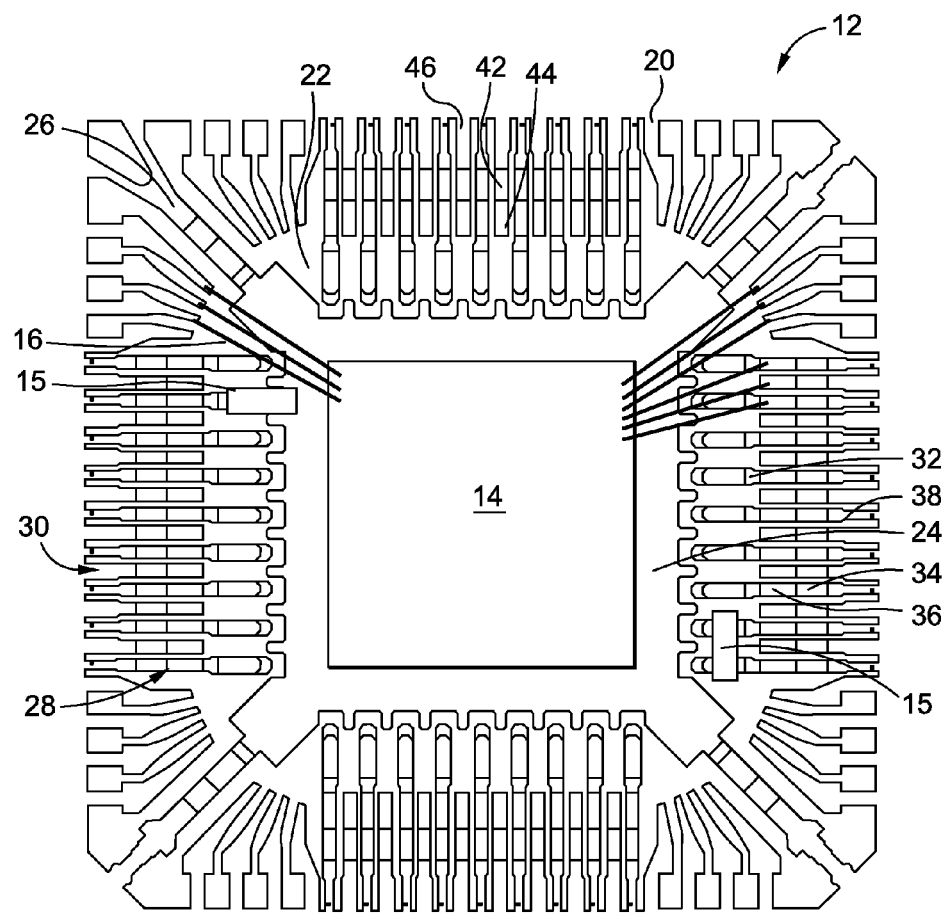
FIG. 4 is a top plan view of the unsingulated leadframe which is integrated into the semiconductor package of the first embodiment of the present invention, further depicting the semiconductor die and a passive component of the semiconductor package as attached to the leadframe.

In addition to the die pad 24, the leadframe 12 of the semiconductor package 10 comprises a plurality of first leads 28 and a plurality of second leads 30 which are each connected to the dambar 20. As seen in FIG. 4, the first leads 28 are segregated into four sets, with the first leads 28 of each set extending along and in spaced relation to a respective one of the four peripheral edge segments defined by the die pad 24. Similarly, the second leads 30 are also segregated into four sets, with the second leads 30 of each set also extending along and in spaced relation to a respective one of the four peripheral edge segments defined by the die pad 24. As is further seen in FIG. 4, some of the second leads 30 of each set thereof are interleaved with the first leads 28 of the corresponding set, i.e., certain ones of the second leads 30 of each set extend between and in spaced relation to a respective pair of the first leads 28 of the corresponding set thereof. Those second leads 30 of each set which extend between a respective pair of the first leads 28 are each generally straight, though being bent to define a downset as will be described in more detail below. Those second leads 30 of each set which are not interleaved with the first leads 28 of the corresponding set each preferably have an inner end portion which is angled relative to the remainder thereof. More particularly, in those second leads 30 having angled inner end portions, the angular displacement of the inner end portions relative to the corresponding segment of the dambar 20 to which such second leads 30 are integrally connected progressively increases as such second leads 30 approach an adjacent one of the tie bars 26.

In the semiconductor package 10, each of the first leads 28 defines a distal, inner end portion 31 and includes a first downset 32 formed therein in relative close proximity to the inner end portion 31. In this regard, the inner end portion 31 of each first lead 28 is disposed between the first downset 32 thereof and the die pad 24. The inner end portion 31 defines opposed top and bottom surfaces which extend in generally coplanar relation to respective ones of the top and bottom pad surfaces defined by the die pad 24. The bottom surface of the inner end portion 31 of each first lead 28 further defines a land 33 of the semiconductor package 10, the use of which will be described in more detail below. In addition to the first downset 32, each of the first leads 28 includes a second downset 34 formed therein between the first downset 32 and the dambar 20. Defined between the first and second downsets 32, 34 is a wire bond zone 36 which extends along a plane elevated above and generally parallel to the common plane on which the die pad 24 and inner end portion 31 of the corresponding first lead 28 reside. Each first lead 28 further defines an outer end portion 38 which extends along a plane elevated above and generally parallel to the plane on which the wire bond zone 36 of the corresponding first lead 28 resides.

Similar to the first leads 28, those second leads 30 which do not include an angled inner end portion each includes a downset 42 formed therein. As a result of the formation of the downset 42 therein, each such second lead 30 defines a wire bond zone 44 which is disposed between the downset 42 and the die paddle 24, and extends in generally co-planar relation to the wire bond zones 36 of the first leads 28, thus residing on the aforementioned second plane. Each second lead 30 further defines an outer end portion 46. For those second leads 30 including the downset 42, the outer end portion 46 extends between the downset 42 and a corresponding segment of the dambar 20, and outwardly beyond such segment of the dambar 20 as best seen in FIG. 5. For those second leads 30 including the angled inner end portion, the outer end portion 46 is attached to and extends outwardly beyond a corresponding segment of the dambar 20. The outer end portions 46 of the second leads 30 extend in generally coplanar relation to the outer end portions 38 of the first leads 28 (thus residing on the aforementioned third plane), with the outer end portions 38, 46 all extending in generally coplanar relation to the dambar 20.

As is further seen in FIG. 5, each of the tie bars 26 is formed to include first and second downsets 48, 50 essentially mirroring the size and location of respective ones of the first and second downsets 32, 34 of each of the first leads 20, thus effectively suspending the die paddle 24 within the opening 22 defined by the dambar 20 in substantially co-planar relation to the inner end portions 31 of the first leads 28 as described above. As a result of the formation of the first and second downsets 48, 50 in each of the tie bars 26, the die pad 24 of the leadframe 12 resides on a plane which is disposed below the plane of the dambar 20, as well as the wire bond zones 36, 44 of the first and second leads 28, 30 integrally connected to the dambar 20. In particular, the die pad 24 and the inner end portions 31 of the first leads 28 reside on a common first plane, with the wire bond zones 36 of the first leads 28 and the wire bond zones 44 of the second leads 30 residing on a second plane which is disposed in spaced, generally parallel relation to the first plane. The outer end portions 38 of the first leads 28, the outer end portions 46 of the second leads 30, and the dambar 20 each reside on a third plane which is itself disposed in spaced, generally parallel relation to the first and second planes, the second plane being disposed between the first and third planes. As also indicated above, it is contemplated that the land 33 defined by the inner end portion 31 of each of the first leads 38 will extend in generally co-planar relation to the bottom pad surface of the die pad 24, with the top surface of each inner end portion 31 which is opposed to the land 33 defined thereby extending in generally co-planar relation to the top pad surface of the die pad 24.

The leadframe 12 of the semiconductor package 10 is preferably fabricated from a conventional metal material, such as copper, copper alloy, steel plated with copper, or a functional equivalent. However, those of ordinary skill in the art will recognize that the present invention is not limited to any particular material for the leadframe 12. Additionally, the number of first and second leads 28, 30 shown in FIG. 4 is for illustrative purposes only, and may be modified according to application field. Along these lines, the first and second leads 28, 30 may have designs or configurations varying from those shown in FIG. 4 without departing from the spirit and scope of the present invention. Additionally, though the first and second leads 28, 30 are each shown as each being segregated into four sets, it will be recognized that fewer sets of the first and second leads 28, 30 may be provided, and may be arranged along any combination of two or three of the peripheral sides of the die paddle 24. Moreover, less than four tie bars 26 may be included in the leadframe 12, extending to respective corners of the die paddle 24 in any combination. It is further contemplated that the leadframe 12 may be fabricated through the implementation of a chemical etching process or alternatively a mechanical stamping process. The above-described potential structural variations are also applicable to the leadframes of the alternative embodiments of the semiconductor package which will be described in more detail below.

In the semiconductor package 10, the semiconductor die 14 is attached to the top pad surface of the die pad 24, such attachment preferably being facilitated through the use of a suitable die attach material, such as an adhesive. Included on the top surface of the semiconductor die 14 is a plurality of bond pads or terminals. In the semiconductor package 10, these terminals of the semiconductor die 14 are electrically connected to respective ones of the first and second leads 28, 30 through the use of the conductive wires 16. In FIG. 4, only a few exemplary wires 16 are depicted, those of ordinary skill in the art recognizing that the semiconductor package 10 will typically include wires 16 in a suitable number which effectively electrically connects the semiconductor die 14 to virtually all of the first and second leads 28, 30 included in the leadframe 12. It is contemplated that for each first lead 28, a corresponding wire 16 will be extended to the wire bond zone 36 defined thereby. For each second lead 30 which includes a downset 42, it is contemplated that the corresponding wires 16 may be extended to the wire bond zone 44 defined thereby. For each second lead 30 including an angled inner end portion, the conductive wire 16 will be extended to the outer end portion 46 thereof. However, it is also contemplated that the wires 16 may also be extended to the outer end portions 38 of the first leads 28, and/or the outer end portions 46 of the second leads 30 which include the downsets 42. The conductive wires 16 may be fabricated from aluminum, copper, gold, silver, or a functional equivalent. However, those of ordinary skill in the art will recognize that the present invention is not limited to any particular material for the wires 16.

Figure 3:
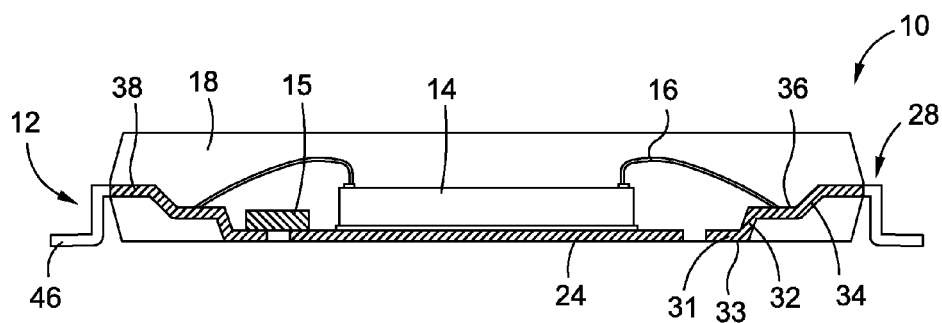
FIG. 3 is a cross-sectional view of the semiconductor package of the first embodiment of the present invention taken along line 3-3 of FIG. 2.

As indicated above, in addition to the semiconductor die 14, attached and electrically connected to the leadframe 12 of the semiconductor package 10 is at least one passive device or passive component 15 of the semiconductor package 10. More particularly, as best seen in FIGS. 3-5, one passive component 15 is attached to and extends between the top surface of the inner end portion 31 of one of the first leads 28, and a peripheral portion of the top pad surface of the die pad 24. In addition to being attached to the inner end portion 31 of the first lead 28 and the die pad 24 in the aforementioned manner, the passive component 15 is also electrically connected thereto. As also seen in FIG. 3, another passive component 15 can be attached (electrically connected) to and extended between the top surfaces of the inner end portions of an adjacent pair of the first leads 28. It is contemplated that the passive component(s) 15 may provide a multiplicity of different circuit configurations on the underlying PCB or motherboard upon which the semiconductor package 10 is mounted and electrically connected, including but not limited to a de-cap capacitor, a voltage divider, and a filter (e.g., a low-pass filter or a band pass filter). Though only two passive components 15 are depicted as being integrated into the semiconductor package 10 in FIG. 3, those of ordinary skill in the art will recognize that more or less than two passive components 15 may be attached and electrically connected to the leadframe 12 in either or both of the orientations shown in FIG. 3.

Figure 2:
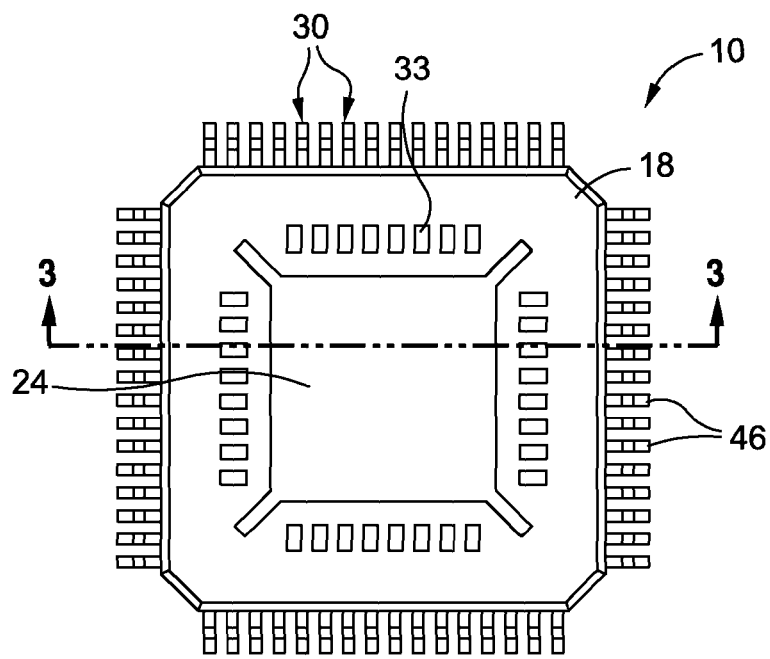
FIG. 2 is a bottom plan view of the semiconductor package shown in FIG. 1.

In the semiconductor package 10, the die paddle 24, the first and second leads 28, 30, the semiconductor die 14, the passive device(s) 15, and the conductive wires 16 are encapsulated or covered by an encapsulant material, which, upon hardening, forms the package body 18 of the semiconductor package 10. As best seen in FIG. 2, in the completed semiconductor package 10, the generally planar lands 33 defined by the inner end portions 31 of the first leads 28 are exposed in and substantially flush with a generally planar bottom surface defined by the fully formed package body 18. Also exposed in and substantially flush with the bottom surface of the package body 18 is the generally planar bottom pad surface of the die pad 24. Distal portions of the outer end portions 46 of the second leads 30 protrude from respective ones of multiple side surfaces defined by the package body 18. These exposed portions of the outer end portions 46 of the second leads 30 are preferably bent so as to impart a generally gull-wing configuration thereto in the manner shown in FIGS. 1, 2 and 3. Other than for the lands 33 of the first leads 28 and those portions of the second leads 30 protruding from the side surfaces of the package body 18, it is contemplated that virtually all of the remainder of each of the first and second leads 28, 30 will be covered by the package body 18.

In fabricating the semiconductor package 10, the package body 18 is formed on the leadframe 12 such that the dambar 20 is not covered by the package body 18, and thus remains exposed therein. As will be recognized, in order to complete the fabrication of the semiconductor package 10 to allow the same to assume the configuration shown in FIGS. 1 and 2, the dambar 20 must be removed from the leadframe 12 to facilitate the electrical isolation of the first and second leads 28, 30 from each other. In this regard, it is contemplated that a conventionally known debarring process may be implemented to remove the dambar 20 as needed to electrically isolate the first leads 28 and the second leads 30 from each other. The completion of such debarring process results in each of the first leads 28 defining an outer, distal end which is exposed in and substantially flush with a respective side surface defined by the package body 18. Further, upon the completion of such debarring process, the exposed portions of the second leads 30 may be bent in the above-described manner to assume the gull-wing configurations. Advantageously, in the semiconductor package 10, the connection of the first and second leads 28, 30 to the common dambar 20 maintains tight positional consistency in relation to the lands 33 of the first leads 28 and exposed outer end portions 46 of the second leads 30. Further, the encapsulation of the first and second downsets 32, 34 of the first leads 28 and downsets 42 of the second leads 30 by the package body 18 facilitates the anchoring or locking of the first and second leads 28, 30 to the package body 18, thus eliminating the need to form any locking features therein via a half-etching or coining technique.

On the underlying PCB or motherboard to which a conventional QFP package is mounted and electrically connected, discrete passive components must typically be independently mounted and electrically connected to such PCB or motherboard as well. In this regard, these discrete passive components are required to fulfill various functions in concert with the QFP package, such as matching/transforming impedance, serving as a voltage divider, providing DC biasing, providing signal line filtering, providing power line filtering ESD protections, serving as a feedback resistor for signal amplifications and control functions, serving as pull up and pull down resistors, serving as tank/timing circuitry, and serving as DC and AC coupling capacitors. Advantageously, by integrating one or more of the passive components 15 directly into the semiconductor package 10 in accordance with the present invention, space need not be taken on the PCB board or motherboard for accommodating discrete passive components in the aforementioned manner. As a result, the PCB or motherboard to which the semiconductor package 10 is mounted and electrically connected can be used for passive component connections. Additionally, the passive component(s) 15 of the semiconductor package 10 can be selectively reconfigured to self-adjust silicon functions, and alignments for signal conditions. The passive component(s) 15 of the semiconductor package 10 may also be used to adjust operating voltages as needed, to adjust de-capacitor values, and/or to convert one frequency band of filter to another band.

Referring now to FIGS. 6-9, there is depicted a semiconductor package 60 constructed in accordance with a second embodiment of the present invention. The major structural elements of the semiconductor package 60 include a leadframe 62, a semiconductor die 64 attached to the leadframe 62 and electrically connected thereto by conductive wires 66, at least one passive component 65 electrically connected to the leadframe 62, and a package body 68 which fully encapsulates the semiconductor die 64, the passive component 65, and wires 66 and partially encapsulates the leadframe 62 in a manner which will be described in more detail below.

Figure 9:
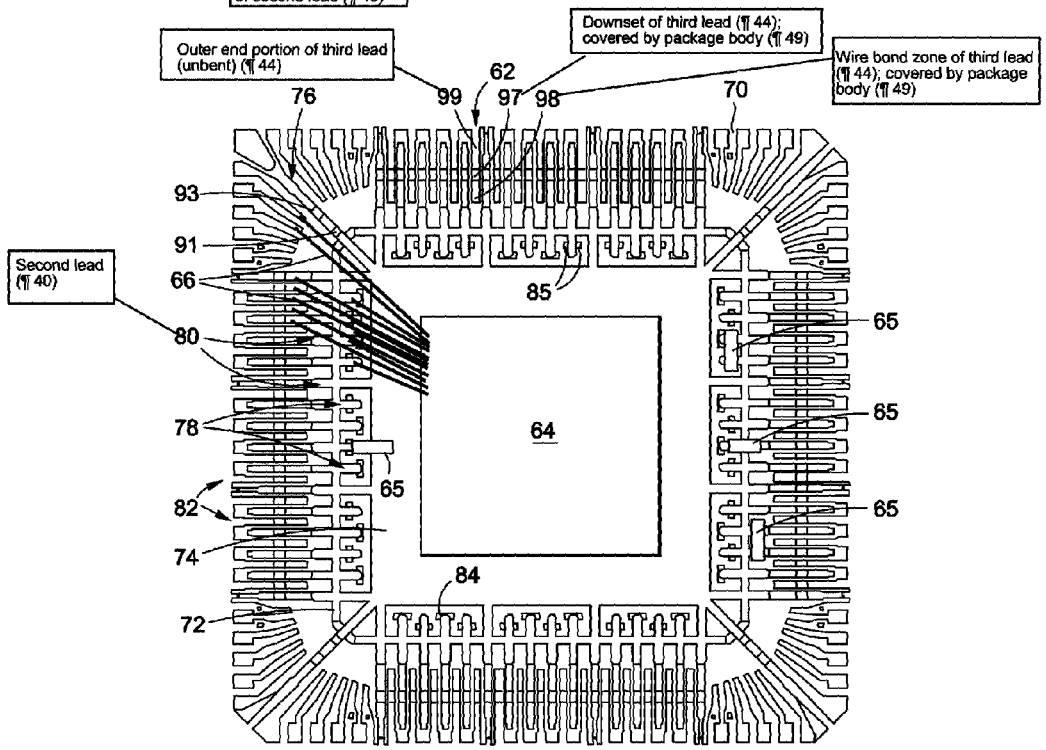
FIG. 9 is a top plan view of the unsingulated leadframe which is integrated into the semiconductor package of the second embodiment of the present invention, further depicting the semiconductor die and passive component of the semiconductor package as attached to the leadframe.

As best seen in FIG. 9, the leadframe 62 of the semiconductor package 60 includes a peripheral outer dambar 70. Located within outer dambar 70 is a continuous, generally quadrangular tie ring 72. Disposed within the tie ring 72 is a generally quadrangular die pad 74 of the leadframe 62. The die pad 74 defines opposed, generally planar top and bottom pad surfaces, and is connected to both the tie ring 72 and the dambar 70 by a plurality of tie bars 76 which extend diagonally from respective ones of the four corners defined by the die paddle 74.

In addition to the die pad 74, the leadframe 62 of the semiconductor package 60 comprises a plurality of first leads 78 which are each integrally connected to the tie ring 72 and extend inwardly toward the die pad 74 in spaced relation thereto, and a plurality of second leads 80 which are each integrally connected to and extend outwardly from the tie ring 72 toward the dambar 70. In addition to the first and second leads 78, 80, the leadframe 62 includes a plurality of third leads 82 which are each integrally connected to the dambar 70. As seen in FIG. 9, the first leads 78 and the second leads 80 are each segregated into four sets, with the first leads 78 and the second leads 80 of each set extending along a respective one of the four peripheral edge segments defined by the die pad 74. In the leadframe 62, certain ones of the first leads 78 of each set are of increased length and are also each integrally connected to the die pad 74 in addition to the tie ring 72, such first leads 78 defining signal pins which extend between the tie ring 72 and the die pad 74. The third leads 82 are also segregated into four sets, with the third leads 82 of each set extending along a respective one of the four peripheral edge segments defined by the die pad 74 in spaced relation thereto. Thus, the first, second and third leads 78, 80, 82 are generally arranged as three concentric rings, the first leads 78 defining an inner ring which is circumvented or circumscribed by a middle ring defined by the second leads 80, such middle ring itself being circumvented by an outer ring defined by the third leads 82.

As further seen in FIG. 9, some of the third leads 82 of each set thereof are interleaved with the second leads 80 of the corresponding set, i.e., certain ones of the third leads 82 of each set extend between and in spaced relation to a respective pair of the second leads 80 of the corresponding set thereof. Those third leads 82 of each set which extend between a respective pair of the second leads 80 are each generally straight, though being bent to define a downset as will be described in more detail below. Those third leads 82 of each set which are not interleaved with the second leads 80 of the corresponding set each preferably have an inner end portion which is angled relative to the remainder thereof. More particularly, in those third leads 82 having angled inner end portions, the angular displacement of the inner end portions relative to the corresponding segment of the dambar 70 to which such third leads 82 are integrally connected progressively increases as such third leads 82 approach an adjacent one of the tie bars 76. Each of the first leads 78 of each set thereof is substantially aligned with a respective one of the second leads 80 of the corresponding set thereof. Those second leads 80 of each set which are aligned with one of the first leads 78 of the corresponding set defining a signal pin are further integrally connected to the dambar 70, and thus extend between the tie ring 72 and the dambar 70.

In the semiconductor package 60, each of the first leads 78 defines opposed, generally planar top and bottom lead surfaces, the bottom lead surfaces defining lands 79 of the semiconductor package 60 which will be discussed in more detail below. Additionally, of those first leads 78 of each set which are not integrally connected to the die pad 74 and thus do not define signal pins, every other one of such first leads 78 includes an enlarged inner end or tip structure 84 which may be formed through the implementation of a partial (half) etching procedure or a coining procedure, and is used to provide a locking feature to strengthen the engagement between the first leads 78 and the package body 68 subsequent to the singulation or removal of the tie ring 72 as will also be discussed in more detail below. If such locking feature is provided, it is contemplated that each first lead 78 will include a shoulder or shelf which is recessed relative to the bottom lead surface thereof and defines the bottom surface of the tip structure 84, such shoulder or shelf further being disposed in opposed relation to that portion of the top lead surface of the corresponding first lead 78 which defines the top surface of the tip structure 84. However, those remaining first leads 78 which do not define signal pins and do not include the tip structure 84 are each formed to include an opposed pair of laterally extending ear portions 85. It is contemplated that such ear portions 85 will also be formed through the implementation of a half-etching procedure, and used to provide a locking feature to strengthen the engagement between those first leads 78 including such ear portions 85 and the package body 68. For those first leads 78 including the ear portions 85 as an alternative to the above-described tip structure 84, it is contemplated that such first leads 78 will include an opposed pair of shoulders or shelves which are recessed relative to the bottom lead surface thereof and define the bottom surfaces of respective ones of the ear portions 85, such shoulders or shelves further being disposed in opposed relation to those portions of the top lead surface of the corresponding first lead 78 which defines the top surfaces of the ear portions 85. Those of ordinary skill in the art will recognize that the above-described tip structure 84 described in relation to certain ones of the first lead 78 may optionally be substituted with ear portions similar to the ear portions 85 described above.

In the semiconductor package 60, each of the second leads 80 defines an inner end portion 86 which extends and is attached to a corresponding segment of the tie ring 72. Each of the second leads 80 also includes a first downset 88 formed therein in relative close proximity to the inner end portion 86. In this regard, the inner end portion 86 of each second lead 80 is disposed between the first downset 88 thereof and the tie ring 72. The inner end portion 86 defines opposed top and bottom surfaces which extend in generally coplanar relation to respective ones of the top and bottom pad surfaces defined by the die pad 74. The bottom surface of the inner end portion 86 of each second lead 80 further defines a land 90 of the semiconductor package 60, the use of which will be described in more detail below. In addition to the first downset 88, each of the second leads 80 includes a second downset 92 formed therein between the first downset 88 and the dambar 70. Defined between the first and second downsets 88, 92 is a wire bond zone 94 which extends along a plane elevated above and generally parallel to the common plane on which the die pad 74 and inner end portion 86 of the corresponding second lead 80 reside. Each second lead 80 further defines an outer end portion 96 which extends along a plane elevated above and generally parallel to the plane on which the wire bond zone 94 of the corresponding second lead 80 resides, the outer end portion 96 being located between the second downset 92 and the dambar 70.

Figure 10:
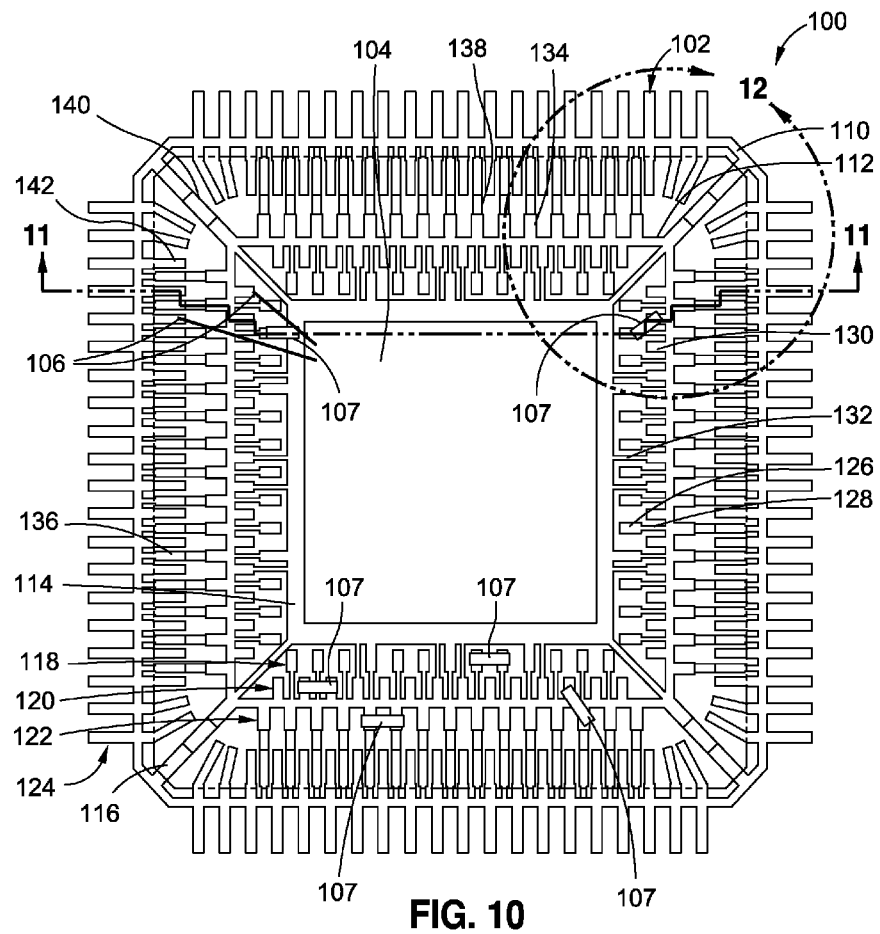
FIG. 10 is a top plan view of a semiconductor package constructed in accordance with a third embodiment of the present invention, the package body being shown in phantom to facilitate the depiction of the leadframe, the semiconductor die and the passive components thereof.

Similar to the second leads 80, those third leads 82 which do not include an angled inner end portion each includes a downset 97 formed therein. As a result of the formation of the downset 97 therein, each such third lead 82 defines a wire bond zone 98 which is disposed between the downset 97 and the tie ring 72, and extends in generally co-planar relation to the wire bond zones 94 of the second leads 80. Each third lead 82 further defines an outer end portion 99. For those third leads 82 including the downset 97, the outer end portion 99 extends between the downset 97 and a corresponding segment of the dambar 70, and outwardly beyond such segment of the dambar 70 as best seen in FIG. 10. For those third leads 82 including the angled inner end portion, the outer end portion 99 is attached to and extends outwardly beyond a corresponding segment of the dambar 70. The outer end portions 96 of the second leads 80 extend in generally coplanar relation to the outer end portions 99 of the third leads 82, with the outer end portions 96, 99 all extending in generally coplanar relation to the dambar 70.

As is seen in FIG. 9, each of the tie bars 76 is formed to include first and second downsets 91, 93 essentially mirroring the size and location of respective ones of the first and second downsets 88, 92 of each of the second leads 80, thus effectively suspending the die pad 74 within the dambar 70 in substantially co-planar relation to the first leads 78 and the inner end portions 86 of the second leads 80. As a result of the formation of the first and second downsets 91, 93 in each of the tie bars 76, the die pad 74 of the leadframe 62 resides on a plane which is disposed below the plane of the dambar 70, as well as the wire bond zones 94, 98 of the second and third leads 80, 82. In particular, the die pad 74, the first leads 78 and the inner end portions 86 of the second leads 80 reside on a common first plane, with the wire bond zones 94, 98 of the second and third leads 80 residing on a second plane which is disposed in spaced, generally parallel relation to the first plane. The outer end portions 96, 99 of the second and third leads 80, 82 and the dambar 70 each reside on a third plane which is itself disposed in spaced, generally parallel relation to the first and second planes, the second plane being disposed between the first and third planes. It is also contemplated that the lands 79, 90 defined by the each of the first and second leads 78, 80 will extend in generally co-planar relation to the bottom pad surface of the die pad 74 and to each other. Similarly, it is also contemplated that the top surface of each inner end portion 86 which is opposed to the land 90 defined thereby and the top lead surface of each first lead 78 which is opposed to the land 79 defined thereby will extend in generally co-planar relation to the top pad surface of the die paddle 74 and to each other.

The leadframe 62 of the semiconductor package 60 is preferably fabricated from a conventional metal material, such as copper, copper alloy, steel plated with copper, or a functional equivalent. However, those of ordinary skill in the art will recognize that the present invention is not limited to any particular material for the leadframe 62. Additionally, the number of first, second and third leads 78, 80, 82 shown in FIG. 9 is for illustrative purposes only, and may be modified according to application field. Along these lines, the first, second and third leads 78, 80, 82 may have designs or configurations varying from those shown in FIG. 9 without departing from the spirit and scope of the present invention. Additionally, though the first, second and third leads 78, 80, 82 are each shown as each being segregated into four sets, it will be recognized that fewer sets of the first, second and third leads 78, 80, 82 may be provided, and may be arranged along any combination of two or three of the peripheral sides of the die pad 74. Moreover, less than four tie bars 76 may be included in the leadframe 62, extending to respective corners of the die paddle 74 in any combination. It is further contemplated that the leadframe 62 may be fabricated through the implementation of a chemical etching process or alternatively a mechanical stamping process.

In the semiconductor package 60, the semiconductor die 64 is attached to the top pad surface of the die pad 74, such attachment preferably being facilitated through the use of a suitable die attach material, such as an adhesive. Included on the top surface of the semiconductor die 74 is a plurality of bond pads or terminals. In the semiconductor package 60, these terminals of the semiconductor die 64 are electrically connected to respective ones of the first, second and third lead 78, 80, 82 through the use of the conductive wires 66. In FIG. 9, only a few exemplary wires 66 are depicted, those of ordinary skill in the art recognizing that the semiconductor package 60 will typically include wires 66 in a suitable number which effectively electrically connects the semiconductor die 64 to virtually all of the first, second and third leads 78, 80, 82 included in the leadframe 62. It is contemplated that for each first lead 78, a corresponding wire 66 will be extended to the top lead surface thereof opposite the land 79 defined thereby. For each second lead 80, it is contemplated that a corresponding wire 66 will be extended to the wire bond zone 94 defined thereby. For each third lead 82 which includes a downset 97, it is contemplated that the corresponding wire 66 may be extended to the wire bond zone 98 defined thereby. For each third lead 82 including an angled inner end portion, the conductive wire 66 will be extended to the outer end portion 99 thereof. However, it is also contemplated that the wires 66 may also be extended to the outer end portions 96 of the second leads 80, and/or the outer end portions 99 of the third leads 82 which include the downsets 97. The conductive wires 66 may be fabricated from aluminum, copper, gold, silver, or a functional equivalent. However, those of ordinary skill in the art will recognize that the present invention is not limited to any particular material for the wires 66.

Figure 8:
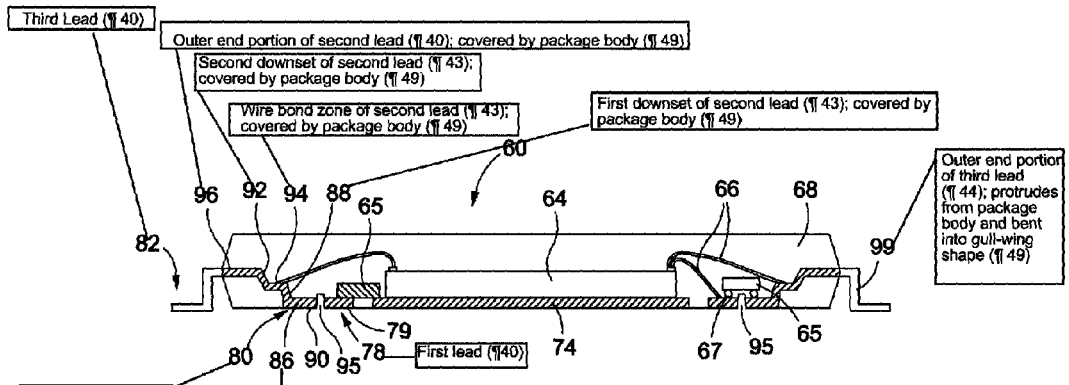
FIG. 8 is a cross-sectional view of the semiconductor package of the second embodiment of the present invention taken along line 8-8 of FIG. 7.

As indicated above, in addition to the semiconductor die 64, attached and electrically connected to the leadframe 62 of the semiconductor package 10 is at least one passive device or passive component 65 of the semiconductor package 10. More particularly, as best seen in FIGS. 8 and 9, a first passive component 65 is attached to and extends between the top lead surface of one of the first leads 78, and a peripheral portion of the top pad surface of the die pad 74. In addition to being attached to the first lead 78 and the die pad 74 in the aforementioned manner, the passive component 65 is also electrically connected thereto. A second passive component 65 is attached (electrically connected) to and extends between the top lead surfaces of an adjacent pair of the first leads 78. A third passive component 65 is attached (electrically connected) to and extends between the top surfaces of the inner end portions 86 of an adjacent pair of the second leads 80. A fourth passive component 65 is attached (electrically connected) to and extends between the top lead surface of one of the first leads 78 and the top surface of the inner end portion 86 of the second lead 80 aligned therewith. As seen in FIG. 8, for that passive component 65 attached to the adjacent pair of first and second leads 78, 80, the electrical connection thereto is preferably facilitated by a pair of solder bumps 67 or solder paste to provide sufficient stand-off height to prevent interference from a saw blade during the partial sawing process used to facilitate the removal of the tie ring 72 as will be described in more detail below. It is contemplated that the passive component(s) 65 may provide a multiplicity of different circuit configurations on the underlying PCB or motherboard upon which the semiconductor package 60 is mounted and electrically connected, including but not limited to a de-cap capacitor, a voltage divider, and a filter (e.g., a low-pass filter or a band pass filter). Though four passive components 65 are depicted as being integrated into the semiconductor package 60 in FIG. 9, those of ordinary skill in the art will recognize that more or less than four passive components 65 may be attached and electrically connected to the leadframe 62 in one or more of the orientations shown in FIG. 9.

In the semiconductor package 60, the die pad 74, the first, second and third leads 78, 80, 82, the semiconductor die 64, the passive component(s) 65, and the conductive wires 66 are encapsulated or covered by an encapsulant material, which, upon hardening, forms the package body 68 of the semiconductor package 60. As best seen in FIG. 7, in the completed semiconductor package 60, the generally planar lands 79, 90 defined by the first and second leads 78, 80 are exposed in and substantially flush with a generally planar bottom surface defined by the fully formed package body 68. Also exposed in and substantially flush with the bottom surface of the package body 68 is the generally planar bottom pad surface of the die pad 74. Distal portions of the outer end portions 99 of the third leads 82 protrude from respective ones of multiple side surfaces defined by the package body 68. These exposed portions of the outer end portions 99 of the third leads 82 are preferably bent so as to impart a generally gull-wing configuration thereto in the manner shown in FIGS. 6-8. Other than for the terminals 79, 90 of the first and second leads 78, 80 and those portions of the third leads 82 protruding from the side surfaces of the package body 68, it is contemplated that virtually all of the remainder of each of the first, second and third leads 78, 80, 82 will be covered by the package body 68.

In fabricating the semiconductor package 60, the package body 68 is formed on the leadframe 62 such that the dambar 70 is not covered by the package body 68, and thus remains exposed therein. As will be recognized, in order to complete the fabrication of the semiconductor package 60 to allow the same to assume the configuration shown in FIGS. 6 and 7, the dambar 70 must be removed from the leadframe 62 to facilitate the electrical isolation of the second and third leads 80, 82 from each other. In this regard, it is contemplated that a conventionally known debarring process may be implemented to remove the dambar 70 as needed to electrically isolate the second leads 80 and the third leads 82 from each other. The completion of such debarring process results in each of the second leads 80 defining an outer, distal end which is exposed in and substantially flush with a respective side surface defined by the package body 68. Further, upon the completion of such debarring process, the exposed portions of the third leads 82 may be bent in the above-described manner to assume the gull-wing configurations.

In addition to electrically isolating the second and third leads 80, 82 from each other in the above-described manner, in fabricating the semiconductor package 60, it is further necessary to effectively facilitate the electrical isolation of the first and second leads 78, 80 from each other. In this regard, subsequent to the formation of the package body 68, it is contemplated that the package body 68 will be subjected to a partial sawing process. In this partial sawing process, a saw blade is penetrated into the bottom surface of the package body 68 to a depth and along axes which facilitate the severing or removal of the tie ring 72, thus electrically isolating the first leads 78 from each other and from the second leads 80. However, it will be recognized that the removal of the tie ring 72 does not electrically isolate any first leads 78 which define signal pins and remain integrally connected to the die pad 74. The artifact which remains in the bottom surface of the package body 68 as a result of such partial sawing or singulation step are four elongate, generally straight grooves 95 which are arranged in a generally quadrangular pattern as shown in FIG. 7. Advantageously, in the semiconductor package 60, the connection of the first and second leads 78, 80 to the common tie ring 72 and the connection of the second and third leads 80, 82 to the common dambar 70 maintains tight positional consistency in relation to the relative orientations of the first, second and third leads 78, 80, 82. Further, the encapsulation of the first and second downsets 88, 92 of the second leads 80 and the downsets 97 of the third leads 82 by the package body 68 facilitates the anchoring or locking of the second and third leads 80, 82 to the package body 68, thus eliminating the need to form any locking features therein via a half-etching or coining technique. The locking of the first leads 78 to the package body 68 is facilitated by the above-described tip structures 84 and/or ear portions 85. The inclusion of the passive component(s) 65 in the completed semiconductor package 60 provides the same advantages highlighted above in relation to the semiconductor package 10.

Figure 11:
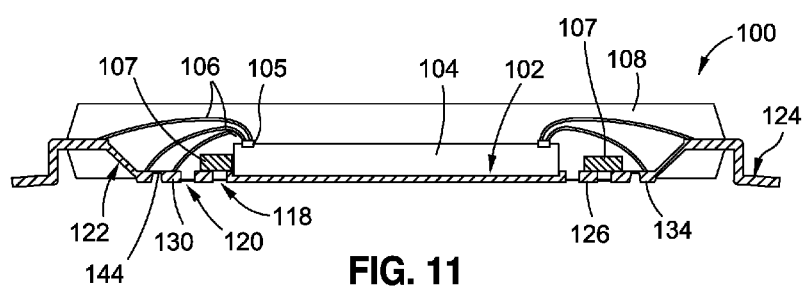
FIG. 11 is a cross-sectional view of the semiconductor package of the third embodiment of the present invention taken along line 11-11 of FIG. 10.
Figure 12:
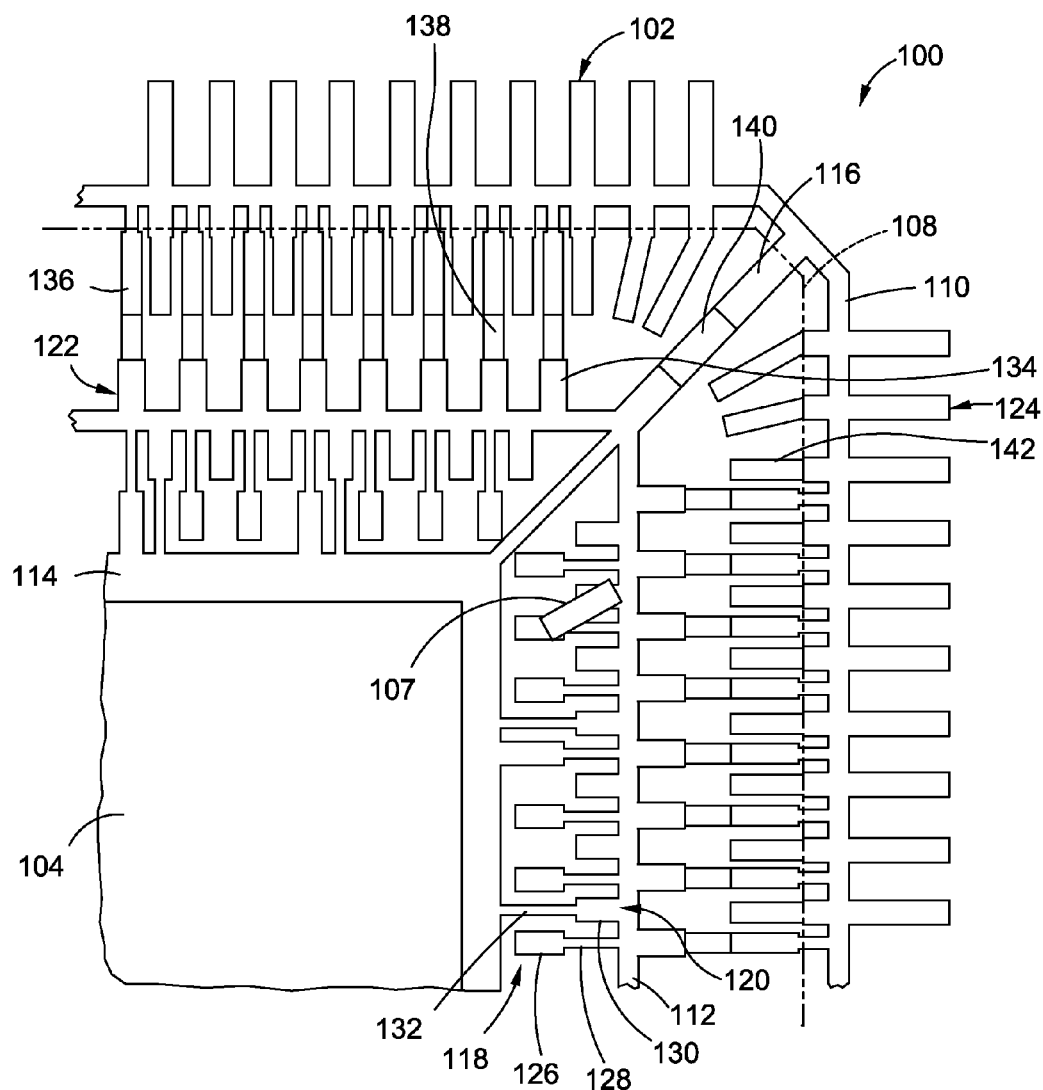
FIG. 12 is an enlargement of the encircled region 12 shown in FIG. 10.

Referring now to FIGS. 10, 11 and 12, there is depicted a semiconductor package 100 constructed in accordance with a third embodiment of the present invention. The major structural elements of the semiconductor package 100 include a leadframe 102, a semiconductor die 104 attached to the leadframe 102 and electrically connected thereto by conductive wires 106, one or more passive components 107 mounted and electrically connected to the leadframe 102, and a package body 108 which fully encapsulates the semiconductor die 104, the passive components(s) 107 and wires 106, and partially encapsulates the leadframe 102 in a manner which will be described in more detail below. In FIG. 10, the outline of the package body 108 of the semiconductor package 100 is shown in phantom so as to provide an unobstructed view of the leadframe 102, semiconductor package 104 attached thereto through the use of the wires 106, and the passive component(s) 107 attached and electrically connected thereto.

The leadframe 102 of the semiconductor package 100 includes a peripheral outer dambar 110. Located within the outer dambar 110 is a continuous, generally quadrangular tie ring 112. Disposed within the tie ring 112 is a generally quadrangular die pad 114 of the leadframe 102. The die pad 114 defines opposed, generally planar top and bottom pad surfaces, and is connected to the both the tie ring 112 and the dambar 110 by a plurality of tie bars 116 which extend diagonally from respective ones of the four corners defined by the die pad 114.

In addition to the die pad 114, the leadframe 102 of the semiconductor package 100 comprises a plurality of first leads 118 which are each integrally connected to the tie ring 112 and extend inwardly toward the die pad 114. The leadframe 102 also includes a plurality of second leads 120 which are also each integrally connected to the tie ring 112 and extend inwardly toward the die pad 114, and a plurality of third leads 122 which are each integrally connected to and extend between the tie ring 112 and the dambar 110. Certain ones of the second leads 120 of each set are also integrally connected to the die pad 114. In addition to the first, second and third leads 118, 120, 122, the leadframe 102 includes a plurality of fourth leads 124 which are each integrally connected to the dambar 110. As seen in FIGS. 10 and 12, the first, second and third leads 118, 120, 122 are each segregated into four sets, with the first, second and third leads 118, 120, 122 of each set extending along a respective one of the four peripheral edge segments defined by the die pad 114. In the leadframe 102, certain ones of the first leads 118 of each set are of increased length and are also each integrally connected to the die pad 114 in addition to the tie ring 112, such first leads 118 defining signal pins which extend between the tie ring 112 and the die pad 114. The fourth leads 124 are also segregated into four sets, with the fourth leads 124 of each set extending along a respective one of the four peripheral edge segments defined by the die pad 114 in spaced relation thereto. Thus, the first, second, third and fourth leads 118, 120, 122, 124 are generally arranged as four concentric rings, the first leads 118 defining an inner ring which is circumvented or circumscribed by a middle inner ring defined by the second leads 120, such middle inner ring itself being circumvented by a middle outer ring defined by the third leads 122. This middle outer ring is circumvented by an outer ring defined by the fourth leads 124. As further seen in FIG. 10, the first and second leads 118, 120 are arranged in a staggered or offset relationship such that a portion of each first lead 118 of each set thereof extends between and in spaced relation to a respective pair of the second leads 120 of the corresponding set thereof. Similarly, the third and fourth leads 122, 124 are arranged in a staggered or offset relationship such that a portion of each third lead 122 of each set thereof extends between and in spaced relation to a respective pair of the fourth leads 124 of the corresponding set thereof. Each set of second leads 120 is also staggered or offset relative to the corresponding set of third leads 122.

In the semiconductor package 100, each of the first leads 118 includes an enlarged pad portion 126 which defines opposed, generally planar top and bottom pad surfaces. In each first lead 118, protruding from the outer end of the pad portion 126 (which is furthest from the die pad 114) is a tie bar portion 128 which is used to operatively connect the pad portion 126 to the tie ring 112. Each of the second leads 120 also includes an enlarged pad portion 130 which defines opposed, generally planar top and bottom pad surfaces. In each second lead 120, the outer end of the pad portion 130 (which is furthest from the die pad 114) is integrally connected to the tie ring 112. Protruding from the opposite, inner end of the pad portion 130 of some of the second leads 120 is a tie bar portion 132 which is used to operatively connect the corresponding pad portion 130 to the die pad 114. Each of the third leads 122 includes an enlarged pad portion 134 which defines opposed, generally planar top and bottom pad surfaces. In each third lead 122, the inner end of the pad portion 134 (which is closest to the die pad 114) is integrally connected to the tie ring 112. Protruding from the opposite, outer end of the pad portion 134 of each third lead 122 is a tie bar portion 136 which is used to operatively connect the pad portion 134 to the dambar 110. It is contemplated that the tie bar portion 136 of each third lead 122 will be formed to include a downset 138 therein such that the pad portion 134 and that segment of the corresponding tie bar portion 136 extending between the downset 138 and the dambar 110 will extend along respective ones of a spaced, substantially parallel pair of planes. Similarly, it is contemplated that each tie bar 116 will be formed to include a downset 140 such that the segment of each tie bar 116 between the downset 140 and the die pad 114 and that segment of the same tie bar 116 between the downset 140 and the dambar 110 will likewise extend along respective ones of a spaced, generally parallel pair of planes.

Each of the fourth leads 124 of the leadframe 102 is integrally connected to only the dambar 110 of the leadframe 102 as indicated above, and as shown in FIGS. 10 and 12. Each fourth lead 124 defines an inner end portion 142 having a width which is slightly less than the width of the remainder thereof. In this regard, the inner end portions 142 of the majority of the fourth leads 124 of each set are disposed between the tie bar portions 136 of a corresponding pair of the third leads 122 in the manner also shown in FIGS. 10 and 12, the inner end portion 142 terminating at approximately the outer ends of the downsets 138 of the corresponding pair of third leads 122. The reduced width of the inner end portions 142 of the fourth leads 124, coupled with the reduced width of the tie bar portion 136 relative to the pad portion 134 in each third lead 122, effectively creates a sufficient pitch or clearance between each of the interleaved sets of the third and fourth leads 122, 124. As further seen in FIGS. 10 and 12, the inner end portions 142 of those fourth leads 124 disposed proximate the tie bars 116 each preferably have an angled or sloped configuration, extending toward a respective one of the peripheral edge segments defined by the die pad 114.

As indicated above, each of the third leads 122 is formed to include the downset 138, with each of the tie bars 116 likewise being formed to include the downset 140. As a result, the die pad 114 of the leadframe 102 resides on a plane which is disposed below the plane of the dambar 110 and hence the fourth leads 124 integrally connected thereto. More particularly, the die pad 114, the first leads 118, the tie ring 112, the second leads 120, and the pad portions 134 of the third leads 122 reside on a first plane, with the dambar 110, fourth leads 124, and those portions of the third leads 122 extending between the downsets 138 and dambar 110 residing on a second plane, such first and second planes being disposed in spaced, generally parallel relation to each other. It is contemplated that the top pad surfaces of the pad portions 126, 130, 134 and the top pad surface of the die pad 114 may extend in generally co-planar relation to each other, and that the bottom pad surfaces of the pad portions 126, 130, 134 and the bottom pad surface of the die pad 114 may likewise extend in generally co-planar relation to each other.

The leadframe 102 as shown in FIG. 10 is preferably fabricated from a conventional metal material, such as copper, copper alloy, steel plated with copper, or a functional equivalent. However, those of ordinary skill in the art will recognize that the present invention is not limited to any particular material for the leadframe 102. Additionally, the number of first, second, third and fourth leads 118, 120, 122, 124 shown in FIG. 6 is for illustrative purposes only, and may be modified according to application field. Along these lines, the first, second, third and fourth leads 118, 120, 122, 124 may have designs or configurations varying from those shown in FIG. 10 without departing from the spirit and scope of the present invention. For example, rather than each pad portion 130, 132, 134 having a generally rectangular configuration as shown in FIG. 10, each such pad portion 130, 132, 134 may be formed to have a generally square configuration. Additionally, though the first, second, third and fourth leads 118, 120, 122, 124 are shown as each being segregated into four sets, it will be recognized that fewer sets of the first, second, third and fourth leads 118, 120, 122, 124 may be provided, and may be arranged along any combination of two or three of the peripheral sides of the die pad 114. Moreover, less than four tie bars 116 may be included in the leadframe 102, extending to respective corners of the die pad 114 in any combination. Due to the connection of each of the first, second and third leads 118, 120, 122 to the tie ring 112 which is itself connected to the tie bars 116, it is contemplated that none of those first leads 118 defining signal pins need be connected to the die pad 114, all of the first leads 118 thus being identically configured. Along these lines, none of the second leads 120 need necessarily include the tie bar portion 132 integrally connecting the same to the die pad 114. It is further contemplated that the leadframe 102 may be fabricated through the implementation of a chemical etching process or alternatively a mechanical stamping process.

In the semiconductor package 100, the semiconductor die 104 is attached to the top pad surface of the die pad 114, such attachment preferably being facilitated through the use of a suitable die attach material, such as an adhesive. Included on the top surface of the semiconductor die 104 is a plurality of bond pads or terminals 105. In the semiconductor package 100, these terminals 105 of the semiconductor die 104 are electrically connected to respective ones of the first, second, third and fourth leads 118, 120, 122, 124 through the use of the conductive wires 106. In FIG. 10, only a few exemplary wires 106 are depicted, those of ordinary skill in the art recognizing that the semiconductor package 100 will typically include wires 106 in a suitable number which effectively electrically connects the semiconductor die 104 to virtually all of the first, second, third and fourth leads 118, 120, 122, 124 included in the leadframe 102. It is contemplated that for each of the first, second and third leads 118, 120, 122, the corresponding wires 106 will be extended to the top pad surfaces of the pad portions 126, 130, 134 thereof. For each fourth lead 124, it is contemplated that the corresponding wire 106 may be extended to any portion of the top lead surface thereof which is ultimately covered by the package body 108 in the manner described below. The conductive wires 106 may be fabricated from aluminum, copper, gold, silver, or a functional equivalent. However, those of ordinary skill in the art will recognize that the present invention is not limited to any particular material for the wires 106.

As indicated above, in addition to the semiconductor die 104, attached and electrically connected to the leadframe 102 of the semiconductor package 100 is at least one passive device or passive component 107 of the semiconductor package 100. More particularly, as seen in FIGS. 10-12, a first passive component 107 is attached to and extends between the top pad surface of the pad portion 126 of one of the first leads 118, and a peripheral portion of the top pad surface of the die pad 114. In addition to being attached to the pad portion 126 of the first lead 118 and the die pad 114 in the aforementioned manner, the first passive component 107 is also electrically connected thereto. Further, a second passive component 107 is attached to and extends between the top pad surface of the pad portion 126 of one of the first leads 118, and the top pad surface of the pad portion 130 of an adjacent one of the second leads 120. In addition to being attached to the pad portion 126 of the first lead 118 and the pad portion 130 of the second lead 120 in the aforementioned manner, the second passive component 107 is also electrically connected thereto. Due to the spatial relationship between the first and second pad portions 126, 130 in the leadframe 102, the second passive component 107 extends angularly therebetween in the manner shown in FIGS. 10 and 12. A third passive component 107 is attached (electrically connected) to and extends between the top pad surfaces of the pad portions 126 of an adjacent pair of the first leads 118. A fourth passive component 107 is attached (electrically connected) to and extends between the top pad surfaces of the pad portions 130 of an adjacent pair of the second leads 120. A fifth passive component 107 is attached (electrically connected) to and extends between the top pad surfaces of the pad portions 134 of an adjacent pair of the third leads 122. A sixth passive component 107 is attached (electrically connected) to and extends between the top pad surface of the pad portion 130 one of the second leads 120 and the top pad surface of the pad portion 134 of an adjacent one of the third leads 122. Due to the spatial relationship between the second and third pad portions 130, 134 in the leadframe 102, the sixth passive component 107 extends angularly therebetween in the manner shown in FIG. 10, with the electrical connection thereof to the pad portions 130, 134 preferably being facilitated by a pair of solder bumps or solder paste to provide sufficient stand-off height to prevent interference from a saw blade during the partial sawing process used to facilitate the removal of the tie ring 112 as will be described in more detail below. It is contemplated that the passive components 107 may provide a multiplicity of different circuit configurations on the underlying PCB or motherboard upon which the semiconductor package 100 is mounted and electrically connected, including but not limited to a de-cap capacitor, a voltage divider, and a filter (e.g., a low-pass filter or a band pass filter). Though six passive components 107 are depicted as being integrated into the semiconductor package 100 in FIG. 10, those of ordinary skill in the art will recognize that more or less than six passive components 107 may be attached and electrically connected to the leadframe 102 in one or more of the orientations shown in FIG. 10.

Referring now to FIG. 11, in the semiconductor package 100, the die pad 114, the first, second, third and fourth leads 118, 120, 122, 124, the semiconductor die 104, the passive component(s) 107, and the conductive wires 106 are encapsulated or covered by an encapsulant material which, upon hardening, forms the package body 108 of the semiconductor package 100. In the completed semiconductor package 100, the generally planar bottom pad surfaces of the pad portions 126, 130, 134 of the first, second and third leads 118, 120, 122 are exposed in and substantially flush with a generally planar bottom surface defined by the fully formed package body 108 and define lands thereof. Also exposed in and substantially flush with the bottom surface of the package body 108 are the generally planar bottom pad surface of the die pad 114 and the generally planar bottom ring surface of the tie ring 112. Distal portions of the fourth leads 124 protrude from respective ones of multiple side surfaces defined by the package body 108. These exposed portions of the fourth leads 124 are preferably bent so as to impart a generally gull-wing configuration thereto in the manner shown in FIG. 7. Other than for the bottom pad surfaces of the pad portions 126, 130, 134 of the first, second and third leads 118, 120, 122 and those portions of the fourth leads 124 protruding from the side surfaces of the package body 108, it is contemplated that the remainder of each of the first, second, third and fourth leads 118, 120, 122, 124 will be covered by the package body 108.

The semiconductor package 100 as shown in FIG. 10 is not depicted in a fully fabricated state since the dambar 110 and tie ring 112 have not yet been removed from the leadframe 102 to effectively facilitate the electrical isolation of the first, second, third and fourth leads 118, 120, 122, 124 from each other. In this regard, subsequent to the formation of the package body 108 in the above-described manner, it is contemplated that the package body 108 will be subjected to a partial saw process. In this partial sawing process, a saw blade is penetrated into the bottom surface of the package body 108 to a depth and along axes which facilitate the severing or removal of the tie ring 112, thus electrically isolating the first and second leads 118, 120 from each other and from the third and fourth leads 122, 124. However, it will be recognized that the removal of the tie ring 112 does not electrically isolate any first leads 118 which define signal pins and remain integrally connected to the die pad 114, or any second leads 120 which remain integrally connected to the die paddle 114 by the corresponding tie bar portions 132. The artifact which remains in the bottom surface of the package body 108 as a result of such partial sawing or singulation step are four elongate, generally straight grooves 144 which are arranged in a generally quadrangular pattern. Prior to the bending of the exposed portions of the fourth leads 124 as described above and subsequent to the formation of the package body 108, it is contemplated that a conventionally known debarring process will be implemented to remove the dambar 110 as needed to electrically isolate the third and fourth leads 122, 124 from each other. Advantageously, in the semiconductor package 100, the connection of the first, second and third leads 118, 120, 122 to the common tie ring 112 and the connection of the third and fourth leads 122, 124 to the common dambar 110 maintains tight positional consistency in relation to the relative orientations of the first, second, third and fourth leads 118, 120, 122, 124. Further, the encapsulation of the downsets 138 of the third leads 122 by the package body 108 facilitates the anchoring or locking of the third leads 122 to the package body 108, thus eliminating the need to form any locking features therein via a half-etching or coining technique. The inclusion of the passive component(s) 107 in the completed semiconductor package 100 provides the same advantages highlighted above in relation to the semiconductor package 10.

Figure 13:
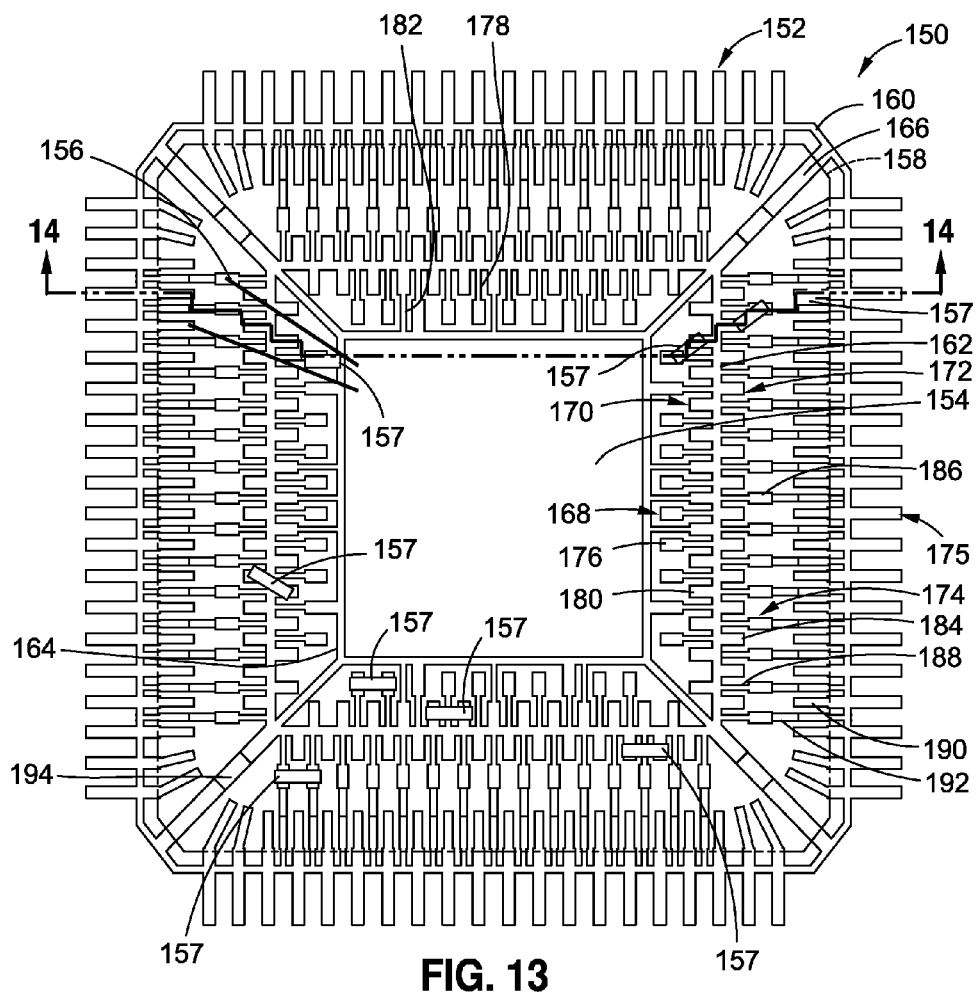
FIG. 13 is a top plan view of a semiconductor package constructed in accordance with a fourth embodiment of the present invention, the package body being shown in phantom to facilitate the depiction of the leadframe, the semiconductor die and the passive components thereof.
Figure 14:
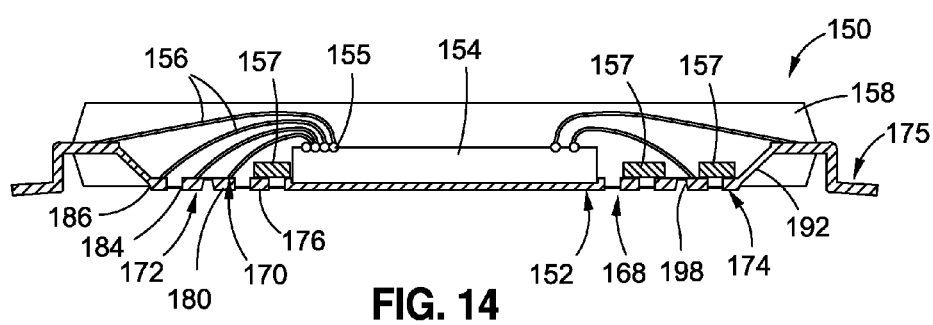
FIG. 14 is a cross-sectional view of the semiconductor package of the fourth embodiment of the present invention taken along line 14-14 of FIG. 13.

Referring now to FIGS. 13 and 14, there is depicted a semiconductor package 150 constructed in accordance with a fourth embodiment of the present invention. The major structural elements of the semiconductor package 150 include a leadframe 152, a semiconductor die 154 attached to the leadframe 152 and electrically connected thereto by conductive wires 156, one or more passive components 157 mounted and electrically connected to the leadframe 152, and a package body 158 which fully encapsulates the semiconductor die 154, the passive component(s) 157 and wires 156, and partially encapsulates the leadframe 152 in a manner which will be described in more detail below. In FIG. 13, the outline of the package body 158 of the semiconductor package 150 is shown in phantom so as to provide an unobstructed view of the leadframe 152, semiconductor die 154 attached thereto through the use of the wires 156, and the passive components(s) 157 attached and electrically connected thereto.

The leadframe 152 of the semiconductor package 150 includes a peripheral outer dambar 160. Located within the outer dambar 160 is a continuous, generally quadrangular tie ring 162. Disposed within the tie ring 162 is a generally quadrangular die pad 164 of the leadframe 152. The die pad 164 defines opposed, generally planar top and bottom pad surfaces, and is connected to the both the tie ring 162 and the dambar 160 by a plurality of tie bars 166 which extend diagonally from respective ones of the four corners defined by the die pad 164.

In addition to the die pad 164, the leadframe 152 of the semiconductor package 150 comprises a plurality of first leads 168 which are each integrally connected to the tie ring 162 and extend inwardly toward the die pad 164. The leadframe 152 also includes a plurality of second leads 170 which are each integrally connected to the tie ring 162 and extend inwardly toward the die pad 164, and a plurality of third leads 172 which are also each integrally connected to the tie ring 162 and extend outwardly toward the dambar 160. Certain ones of the second leads 170 of each set are also integrally connected to the die pad 164. Also included in the leadframe 152 is a plurality of fourth leads 174 which are each integrally connected to and extend between the tie ring 162 and the dambar 160, and a plurality of fifth leads 175 which are each integrally connected to the dambar 160.

As seen in FIG. 13, the first, second, third, fourth and fifth leads 168, 170, 172, 174, 175 are each segregated into four sets, with the first, second, third, fourth and fifth leads 168, 170, 172, 174, 175 of each set extending along a respective one of the four peripheral edge segments defined by the die pad 164. In the leadframe 152, certain ones of the first leads 168 of each set are of increased length and are also each integrally connected to the die pad 164 in addition to the tie ring 162, such first leads 168 defining signal pins which extend between the tie ring 162 and the die pad 164. Thus, the first, second, third, fourth and fifth leads 168, 170, 172, 174, 175 are generally arranged as five concentric rings, the first leads 168 defining an inner ring which is circumvented or circumscribed by a middle inner ring defined by the second leads 170, such middle inner ring itself being circumvented by a middle ring defined by the third leads 172. This middle ring is circumvented by a middle outer ring defined by the fourth leads 174, with such middle outer ring being circumvented by an outer ring defined by the fifth leads 175. As further seen in FIG. 13, the first and second leads 168, 170 are arranged in a staggered or offset relationship such that a portion of each first lead 168 of each set thereof extends between and in spaced relation to a respective pair of the second leads 170 of the corresponding set thereof. Similarly, the third and fourth leads 172, 174 are arranged in a staggered or offset relationship such that each third lead 172 of each set thereof extends between and in spaced relation to a respective pair of the fourth leads 174 of the corresponding set thereof. The fourth and fifth leads 174, 175 are also arranged in a staggered or offset relationship such that a portion of each fourth lead 172 of each set thereof extends between and in spaced relation to a respective pair of the fifth leads 175 of the corresponding set thereof. Each set of second leads 170 is also staggered or offset relative to the corresponding set of third leads 172.

In the semiconductor package 150, each of the first leads 168 includes an enlarged pad portion 176 which defines opposed, generally planar top and bottom pad surfaces. In each first lead 168, protruding from the outer end of the pad portion 176 (which is furthest from the die pad 114) is a tie bar portion 178 which is used to operatively connect the pad portion 176 to the tie ring 162. Each of the second leads 170 also includes an enlarged pad portion 180 which defines opposed, generally planar top and bottom pad surfaces. In each second lead 170, the outer end of the pad portion 180 (which is furthest from the die pad 164) is integrally connected to the tie ring 162. Protruding from the opposite, inner end of the pad portion 180 of some of the second leads 170 is a tie bar portion 182 which is used to operatively connect the corresponding pad portion 180 to the die pad 164. Each of the third leads 172 includes an enlarged pad portion 184 which defines opposed, generally planar top and bottom pad surfaces. In each third lead 172, the inner end of the pad portion 184 (which is closest to the die pad 164) is integrally connected to the tie ring 162. Each of the fourth leads 174 includes an enlarged pad portion 186 which defines opposed, generally planar top and bottom pad surfaces. In each fourth lead 174, protruding from the inner end of the pad portion 186 (which is closest to the die pad 164) is an inner tie bar portion 188 which is used to operatively connect the pad portion 186 to an adjacent segment of the tie ring 162. Protruding from the opposite, outer end of the pad portion 186 is an outer tie bar portion 190 which is used to operatively connect the pad portion 186 to the dambar 160. It is contemplated that the outer tie bar portion 190 of each fourth lead 174 will be formed to include a downset 192 therein such that the pad portion 186 and that segment of the corresponding tie bar portion 190 extending between the downset 192 and the dambar 160 will extend along respective ones of a spaced, substantially parallel pair of planes. Similarly, it is contemplated that each tie bar 166 will be formed to include a downset 194 such that the segment of each tie bar 166 between the downset 194 and the die paddle 164 and that segment of the same tie bar 166 between the downset 194 and the dambar 160 will likewise extend along respective ones of a spaced, generally parallel pair of planes.

Each of the fifth leads 175 of the leadframe 152 is integrally connected to only the dambar 160 of the leadframe 152 as indicated above, and as shown in FIG. 13. Each fifth lead 175 defines an inner end portion 196 having a width which is slightly less than the width of the remainder thereof. In this regard, the inner end portions 196 of the majority of the fifth leads 175 of each set are disposed between the inner tie bar portions 188 of a corresponding pair of the fourth leads 172 in the manner also shown in FIG. 13, the inner end portion 196 terminating at approximately the outer ends of the downsets 192 of the corresponding pair of fourth leads 172. The reduced width of the inner end portions 196 of the fifth leads 175, coupled with the reduced width of the inner tie bar portion 188 relative to the pad portion 186 in each fourth lead 172, effectively creates a sufficient pitch or clearance between each of the interleaved sets of the fourth and fifth leads 174, 175. As further seen in FIG. 13, the inner end portions 196 of those fifth leads 175 disposed proximate the tie bars 166 each preferably have an angled or sloped configuration, extending toward a respective one of the peripheral edge segments defined by the die pad 164.

As indicated above, each of the fourth leads 172 is formed to include the downset 192, with each of the tie bars 166 likewise being formed to include the downset 194. As a result, the die pad 164 of the leadframe 152 resides on a plane which is disposed below the plane of the dambar 160 and hence the fifth leads 175 integrally connected thereto. More particularly, the die pad 164, the first leads 168, the second leads 170, the tie ring 162, the third leads 172, and the pad portions 184 of the fourth leads 174 reside on a first plane, with the dambar 160, fifth leads 175, and those portions of the fourth leads 174 extending between the downsets 192 and dambar 160 residing on a second plane, such first and second planes being disposed in spaced, generally parallel relation to each other. It is contemplated that the top pad surfaces of the pad portions 176, 180, 184, 186 and the top pad surface of the die pad 164 may extend in generally co-planar relation to each other, and that the bottom pad surfaces of the pad portions 176, 180, 184, 188 and the bottom pad surface of the die pad 164 may likewise extend in generally co-planar relation to each other.

The leadframe 152 as shown in FIG. 13 is preferably fabricated from a conventional metal material, such as copper, copper alloy, steel plated with copper, or a functional equivalent. However, those of ordinary skill in the art will recognize that the present invention is not limited to any particular material for the leadframe 152. Additionally, the number of first, second, third, fourth and fifth leads 168, 170, 172, 174, 175 shown in FIG. 13 is for illustrative purposes only, and may be modified according to application field. Along these lines, the first, second, third, fourth and fifth leads 168, 170, 172, 174, 175 may have designs or configurations varying from those shown in FIG. 13 without departing from the spirit and scope of the present invention. For example, rather than each pad portion 176, 180, 184, 186 having a generally rectangular configuration as shown in FIG. 13, each such pad portion 176, 180, 184, 186 may be formed to have a generally square configuration. Additionally, though the first, second, third, fourth and fifth leads 168, 170, 172, 174, 175 are shown as each being segregated into four sets, it will be recognized that fewer sets of the first, second, third, fourth and fifth leads 168, 170, 172, 174, 175 may be provided, and may be arranged along any combination of two or three of the peripheral sides of the die pad 164. Moreover, less than four tie bars 166 may be included in the leadframe 152, extending to respective corners of the die pad 164 in any combination. Due to the connection of each of the first, second, third and fourth leads 168, 170, 172, 174 to the tie ring 162 which is itself connected to the tie bars 166, it is contemplated that none of those first leads 168 defining signal pins need be connected to the die pad 164, all of the first leads 168 thus being identically configured. Along these lines, none of the second leads 170 need necessarily include the tie bar portion 182 integrally connecting the same to the die pad 164. It is further contemplated that the leadframe 152 may be fabricated through the implementation of a chemical etching process or alternatively a mechanical stamping process.

In the semiconductor package 150, the semiconductor die 154 is attached to the top pad surface of the die pad 164, such attachment preferably being facilitated through the use of a suitable die attach material, such as an adhesive. Included on the top surface of the semiconductor die 154 is a plurality of bond pads or terminals 155. In the semiconductor package 150, these terminals 155 of the semiconductor die 154 are electrically connected to respective ones of the first, second, third, fourth and fifth leads 168, 170, 172, 174, 175 through the use of the conductive wires 156. In FIG. 13, only a few exemplary wires 156 are depicted, those of ordinary skill in the art recognizing that the semiconductor package 150 will typically include wires 156 in a suitable number which effectively electrically connects the semiconductor die 154 to virtually all of the first, second, third, fourth and fifth leads 168, 170, 172, 174, 175 included in the leadframe 152. It is contemplated that for each of the first, second, third and fourth leads 168, 170, 172, 174, the corresponding wires 156 will be extended to the top pad surfaces of the pad portions 176, 180, 184, 186 thereof. For each fifth lead 175, it is contemplated that the corresponding wire 156 may be extended to any portion of the top lead surface thereof which is ultimately covered by the package body 158 in the manner described below. The conductive wires 156 may be fabricated from aluminum, copper, gold, silver, or a functional equivalent. However, those of ordinary skill in the art will recognize that the present invention is not limited to any particular material for the wires 156.

As indicated above, in addition to the semiconductor die 154, attached and electrically connected to the leadframe 152 of the semiconductor package 150 is at least one passive device or passive component 157 of the semiconductor package 150. More particularly, as seen in FIGS. 13 and 14, a first passive component 157 is attached to and extends between the top pad surface of the pad portion 176 of one of the first leads 168, and a peripheral portion of the top pad surface of the die pad 164. In addition to being attached to the pad portion 176 of the first lead 168 and the die pad 164 in the aforementioned manner, the first passive component 157 is also electrically connected thereto. Further, a second passive component 157 is attached to and extends between the top pad surface of the pad portion 176 of one of the first leads 168, and the top pad surface of the pad portion 180 of an adjacent one of the second leads 170. In addition to being attached to the pad portion 176 of the first lead 168 and the pad portion 180 of the second lead 170 in the aforementioned manner, the second passive component 157 is also electrically connected thereto. Moreover, a third passive component 157 is attached to and extends between the top pad surface of the pad portion 184 of one of the third leads 172, and the top pad surface of the pad portion 186 of an adjacent one of the fourth leads 174. In addition to being attached to the pad portion 184 of the third lead 172 and the pad portion 186 of the fourth lead 174 in the aforementioned manner, the third passive component 157 is also electrically connected thereto.

Due to the spatial relationship between the pad portions 176, 180 and between the pad portions 184, 186 in the leadframe 152, the second passive component 157 extends angularly between the pad portions 176, 180, with the third passive component 157 extending angularly between the pad portions 184, 186 in the manner shown in FIG. 13. In addition to the foregoing, a fourth passive component 157 is attached (electrically connected) to and extends between the top pad surfaces of the pad portions 176 of an adjacent pair of the first leads 168. A fifth passive component 157 is attached (electrically connected) to and extends between the top pad surfaces of the pad portions 180 of an adjacent pair of the second leads 170. A sixth passive component 157 is attached (electrically connected) to and extends between the top pad surfaces of the pad portions 184 of an adjacent pair of the third leads 172. A seventh passive component 157 is attached (electrically connected) to and extends between the top pad surfaces of the pad portions 186 of an adjacent pair of the fourth leads 174. A eighth passive component 157 is attached (electrically connected) to and extends between the top pad surface of the pad portion 180 one of the second leads 170 and the top pad surface of the pad portion 184 of an adjacent one of the third leads 172. Due to the spatial relationship between the second and third pad portions 180, 184 in the leadframe 152, the eighth passive component 107 extends angularly therebetween in the manner shown in FIG. 13, with the electrical connection thereof to the pad portions 180, 184 preferably being facilitated by a pair of solder bumps or solder paste to provide sufficient stand-off height to prevent interference from a saw blade during the partial sawing process used to facilitate the removal of the tie ring 162 as will be described in more detail below. It is contemplated that the passive components 157 may provide a multiplicity of different circuit configurations on the underlying PCB or motherboard upon which the semiconductor package 150 is mounted and electrically connected, including but not limited to a de-cap capacitor, a voltage divider, and a filter (e.g., a low-pass filter or a band pass filter). Though eight passive components 157 are depicted as being integrated into the semiconductor package 150 in FIG. 13, those of ordinary skill in the art will recognize that more or less than eight passive components 157 may be attached and electrically connected to the leadframe 152 in one or more of the orientations shown in FIG. 13.

Referring now to FIG. 14, in the semiconductor package 150, the die pad 164, the first, second, third, fourth and fifth leads 168, 170, 172, 174, 175, the semiconductor die 154, the passive component(s) 157, and the conductive wires 156 are encapsulated or covered by an encapsulant material which, upon hardening, forms the package body 158 of the semiconductor package 150. In the completed semiconductor package 150, the generally planar bottom pad surfaces of the pad portions 176, 180, 184, 186 of the first, second, third and fourth leads 168, 170, 172, 174 are exposed in and substantially flush with a generally planar bottom surface defined by the fully formed package body 158 and define lands thereof. Also exposed in and substantially flush with the bottom surface of the package body 158 are the generally planar bottom pad surface of the die pad 164 and the generally planar bottom ring surface of the tie ring 162. Distal portions of the fifth leads 175 protrude from respective ones of multiple side surfaces defined by the package body 158. These exposed portions of the fifth leads 175 are preferably bent so as to impart a generally gull-wing configuration thereto in the manner shown in FIG. 10. Other than for the bottom pad surfaces of the pad portions 176, 180, 184, 186 of the first, second, third and fourth leads 168, 170, 172, 174 and those portions of the fifth leads 175 protruding from the side surfaces of the package body 158, it is contemplated that the remainder of each of the first, second, third, fourth and fifth leads 168, 170, 172, 174, 175 will be covered by the package body 158.

The semiconductor package 150 as shown in FIG. 13 is not depicted in a fully fabricated state since the dambar 160 and tie ring 162 have not yet been removed from the leadframe 152 to effectively facilitate the electrical isolation of the first, second, third, fourth and fifth leads 168, 170, 172, 174, 175 from each other. In this regard, subsequent to the formation of the package body 158 in the above-described manner, it is contemplated that the package body 158 will be subjected to a partial saw process. In this partial sawing process, a saw blade is penetrated into the bottom surface of the package body 158 to a depth and along axes which facilitate the severing or removal of the tie ring 162, thus electrically isolating the first, second and third leads 168, 170, 172 from each other and from the fourth and fifth leads 174, 175. However, it will be recognized that the removal of the tie ring 162 does not electrically isolate any first leads 168 which define signal pins and remain integrally connected to the die pad 164, or any second leads 170 which remain integrally connected to the die pad 164 by the corresponding tie bar portions 182. The artifact which remains in the bottom surface of the package body 158 as a result of such partial sawing or singulation step are four elongate, generally straight grooves 198 which are arranged in a generally quadrangular pattern. Prior to the bending of the exposed portions of the fifth leads 175 as described above and subsequent to the formation of the package body 158, it is contemplated that a conventionally known debarring process will be implemented to remove the dambar 160 as needed to electrically isolate the fourth and fifth leads 174, 175 from each other. Advantageously, in the semiconductor package 150, the connection of the first, second, third and fourth leads 168, 170, 172, 174 to the common tie ring 162 and the connection of the fourth and fifth leads 174, 175 to the common dambar 160 maintains tight positional consistency in relation to the relative orientations of first, second, third, fourth and fifth leads 168, 170, 172, 174, 175. Further, the encapsulation of the downsets 192 of the fourth leads 174 by the package body 158 facilitates the anchoring or locking of the fourth leads 174 to the package body 158, thus eliminating the need to form any locking features therein via a half-etching or coining technique. The inclusion of the passive component(s) 157 in the completed semiconductor package 150 provides the same advantages highlighted above in relation to the semiconductor package 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a generally planar die pad defining multiple peripheral edge segments;
   a plurality of first leads which each include first and second downsets formed therein in spaced relation to each other, the first leads being disposed in spaced relation to the die pad;
   a plurality of second leads, at least some of which include a downset formed therein, the second leads being disposed in spaced relation to the die pad;
   a semiconductor die attached to the die pad and electrically connected to at least one of each of the first and second leads;
   at least one passive component electrically connected to and extending between adjacent portions of the leadframe; and
   a package body defining a generally planar bottom surface and multiple side surfaces, the package body at least partially encapsulating the first and second leads, the semiconductor die and the passive component such that the first and second downsets of the first leads and the downsets of the second leads are covered by the package body, at least portions of the die pad and the first leads are exposed in and substantially flush with the bottom surface of the package body, and portions of the second leads protrude from respective ones of the side surfaces of the package body.

2. The semiconductor package of claim 1 wherein the at least one passive component comprises
   a first passive component electrically connected to and extending between
   an adjacent pair of the first leads.

3. The semiconductor package of claim 1 wherein the semiconductor die is electrically connected to the first and second leads by conductive wires which are covered by the package body.

4. The semiconductor package of claim 3 wherein:
   each of the first leads includes an inner end portion, a wire bond zone, and an outer end portion, the inner end portion being disposed between the first downset thereof and the die pad and defining a land which is exposed in the bottom surface of the package body, the first downset extending between the inner end portion and the wire bond zone thereof, and the second downset extending between the wire bond zone and the outer end portion thereof;
   each of the second leads includes a wire bond zone and an outer end portion, the downset of each of the second leads extending between the wire bond zone and the outer end portion thereof;

and the conductive wires extend from the semiconductor die to respective ones of the wire bond zones of the first leads and second leads.

5. The semiconductor package of claim 4 wherein:

the die pad and the inner end portions of the first leads extend along a first plane;

the wire bond zones of the first and second leads each extend along a second plane which is disposed in spaced, generally parallel relation to the first plane; and the outer end portions of the first and second leads each extend along a third plane which is disposed in spaced, generally parallel relation to the second plane such that the second plane extends between the first and third planes.

6. A semiconductor package comprising:

a generally planar die pad defining multiple peripheral edge segments;

a plurality of first leads disposed in spaced relation to the die pad;

a plurality of second leads which each include first and second downsets formed therein in spaced relation to each other, the second leads being disposed in spaced relation to the die pad;

a plurality of third leads, at least some of which include a downset formed therein, the third leads being disposed in spaced relation to the die pad;

a semiconductor die attached to the die pad and electrically connected to at least one of each of the first, second and third leads;

at least one passive component electrically connected to and extending between adjacent portions of the leadframe; and a package body defining a generally planar bottom surface and multiple side surfaces, the package body at least partially encapsulating the first, second and third leads, the semiconductor die and the passive component such that the first and second downsets of the second leads and the downsets of the third leads are covered by the package body, at least portions of the die pad and the first and second leads are exposed in and substantially flush with the bottom surface of the package body, and portions of the third leads protrude from respective ones of the side surfaces of the package body.

7. The semiconductor package of claim 6 wherein at least some of the first leads are integrally connected to the die pad and define signal pins.

8. The semiconductor package of claim 6 wherein the at least one passive component comprises one or more of:

a first passive component electrically connected to and extending between one of the first leads and the die pad;

a second passive component electrically connected to and extending between an adjacent pair of the first leads;

a third passive component electrically connected to and extending between an adjacent pair of the second leads; and a fourth passive component electrically connected to and extending between an adjacent pair of the first and second leads.

9. The semiconductor package of claim 8 wherein the fourth passive component is electrically connected to each of the first and second leads of the adjacent pair by a stand-off feature.

10. The semiconductor package of claim 6 wherein the semiconductor die is electrically connected to the first, second and third leads by conductive wires which are covered by the package body.

11. The semiconductor package of claim 10 wherein:

each of the first leads defines a land which is exposed in the bottom surface of the package body;

each of the second leads includes an inner end portion, a wire bond zone, and an outer end portion, the inner end portion being disposed between the first downset thereof and the die pad and defining a land which is exposed in the bottom surface of the package body, the first downset extending between the inner end portion and the wire bond zone thereof, and the second downset extending between the wire bond zone and the outer end portion thereof;

each of the third leads includes a wire bond zone and an outer end portion, the downset of each of the third leads extending between the wire bond zone and the outer end portion thereof; and the conductive wires extend from the semiconductor die to respective ones of the first leads and the wire bond zones of the second leads and third leads.

12. The semiconductor package of claim 11 wherein:

the die pad, the first leads and the inner end portions of the second leads extend along a first plane;

the wire bond zones of the second and third leads each extend along a second plane which is disposed in spaced, generally parallel relation to the first plane; and the outer end portions of the second and third leads each extend along a third plane which is disposed in spaced, generally parallel relation to the second plane such that the second plane extends between the first and third planes.

13. A semiconductor package comprising:

a generally planar die pad defining multiple peripheral edge segments;

a plurality of first leads which are disposed in spaced relation to the die pad;

a plurality of second leads which are disposed in spaced relation to the die pad;

a plurality of third leads which each include a downset formed therein, the third leads being disposed in spaced relation to the die pad;

a semiconductor die attached to the die pad and electrically connected to at least one of each of the first, second, and third leads;

at least one passive component electrically connected to and extending between adjacent portions of the leadframe; and a package body defining a generally planar bottom surface and multiple side surfaces, the package body at least partially encapsulating the first, second, and third leads, the semiconductor die, and the passive component such that the downsets of the third leads are covered by the package body, at least portions of the die pad and the first and second leads are exposed in and substantially flush with the bottom surface of the package body, and portions of the third leads protrude from respective ones of the side surfaces of the package body.

14. The semiconductor package of claim 13 wherein the at least one passive component comprises one or more of:

a first passive component electrically connected to and extending between one of the first leads and the die pad;

a second passive component electrically connected to and extending between an adjacent pair of the first and second leads;

a third passive component electrically connected to and extending between an adjacent pair of the first leads; and a fourth passive component electrically connected to and extending between an adjacent pair of the second leads.

15. The semiconductor package of claim 14 wherein the second passive component is electrically connected to each of the first and second leads of the adjacent pair by a stand-off feature.

16. The semiconductor package of claim 13 wherein:
each of the first leads defines a land which is exposed in the bottom surface of the package body;
each of the second leads defines a land which is exposed in the bottom surface of the package body;
the die pad, and the lands of the first and second leads extend along a first plane; and
portions of the third leads each extend along a second plane which is disposed in spaced, generally parallel relation to the first plane.

17. A semiconductor package comprising:
a generally planar die pad defining multiple peripheral edge segments;
a plurality of first leads which are disposed in spaced relation to the die pad;
a plurality of second leads which each include first and second downsets formed therein in spaced relation to each other, the second leads being disposed in spaced relation to the die pad;
a plurality of third leads which are disposed in spaced relation to the die pad;
a semiconductor die attached to the die pad and electrically connected to at least one of each of the first, second, and third leads;
at least one passive component electrically connected to and extending between adjacent portions of the leadframe; and
a package body defining a generally planar bottom surface and multiple side surfaces, the package body at least partially encapsulating the first, second, and third leads, the semiconductor die, and the passive component such that the downsets of the second leads are covered by the package body, at least portions of the die pad and the first and second leads are exposed in and substantially flush with the bottom surface of the package body, and portions of the third leads protrude from respective ones of the side surfaces of the package body.

18. The semiconductor package of claim 17 wherein the at least one passive component comprises one or more of:
a first passive component electrically connected to and extending between one of the first leads and the die pad;
a second passive component electrically connected to and extending between an adjacent pair of the first and second leads;
a third passive component electrically connected to and extending between an adjacent pair of the first leads; and
a fourth passive component electrically connected to and extending between an adjacent pair of the second leads.

19. The semiconductor package of claim 18 wherein the second passive component is electrically connected to each of the first and second leads of the adjacent pair by a stand-off feature.

20. The semiconductor package of claim 17 wherein:
each of the first leads defines a land which is exposed in the bottom surface of the package body;
each of the second leads defines a land which is exposed in the bottom surface of the package body;
the die pad, and the lands of the first and second leads extend along a first plane; and
portions of the third leads extend along a second plane which is disposed in spaced, generally parallel relation to the first plane.

* * * * *